US011895861B2

(12) United States Patent
Kim et al.

(10) Patent No.: US 11,895,861 B2
(45) Date of Patent: Feb. 6, 2024

(54) DISPLAY DEVICE INCLUDING SUB-INORGANIC LAYERS

(71) Applicant: Samsung Display Co., Ltd., Yongin-si (KR)

(72) Inventors: Yong Tack Kim, Yongin-si (KR); Cheol Eon Park, Seoul (KR); Hak Joong Yong, Yongin-si (KR); Yun Kyu Lee, Gumi-si (KR); Yoon Hyeung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 291 days.

(21) Appl. No.: 17/221,733

(22) Filed: Apr. 2, 2021

(65) Prior Publication Data

US 2021/0399260 A1   Dec. 23, 2021

(30) Foreign Application Priority Data

Jun. 17, 2020   (KR) .......................... 10-2020-0073592

(51) Int. Cl.
*H10K 50/84* (2023.01)
*H10K 59/12* (2023.01)
(Continued)

(52) U.S. Cl.
CPC ........... *H10K 50/844* (2023.02); *H10K 59/38* (2023.02); *G02F 1/133512* (2013.01);
(Continued)

(58) Field of Classification Search
CPC .. H10K 50/844; H10K 50/854; H10K 50/858; H10K 50/84; H10K 50/8426; H10K 50/17; H10K 50/171; H10K 50/15; H10K 50/16; H10K 50/8445; H10K 50/115; H10K 59/38; H10K 59/32; H10K 59/00; H10K 59/50; H10K 59/126; H10K 59/35;
(Continued)

(56) References Cited

U.S. PATENT DOCUMENTS 9,786,721 B1   10/2017   Tang
10,522,777 B2 *   12/2019   Ushikubo ............ H10K 50/852
(Continued)

FOREIGN PATENT DOCUMENTS

EP              3624199 A2 *    3/2020   ......... H01L 27/3206
KR          20190047592 A  *    5/2019   ........... H10K 50/844
(Continued)

OTHER PUBLICATIONS

Extended European Search Report issued in related European Application No. 21180133.7 dated Nov. 16, 2021, 9 pages.

*Primary Examiner* — Ida M Soward
(74) *Attorney, Agent, or Firm* — Lewis Roca Rothgerber Christie LLP

(57) ABSTRACT

A display device includes a base; a light emitting element on the base; a capping layer on the light emitting element; a thin-film encapsulation layer including a first inorganic layer on the capping layer, an organic layer on the first inorganic layer, and a second inorganic layer on the organic layer; and a wavelength conversion pattern on the thin-film encapsulation layer and overlapping the light emitting element, wherein the first inorganic layer includes two sub-inorganic layers having different refractive indices.

26 Claims, 25 Drawing Sheets

(51) Int. Cl.
  H10K 59/13   (2023.01)
  H10K 50/844  (2023.01)
  H10K 59/38   (2023.01)
  G02F 1/1335      (2006.01)
  H10K 50/17       (2023.01)
  H10K 59/123      (2023.01)
  G02F 1/1362      (2006.01)
  H10K 59/131      (2023.01)
  H10K 102/00      (2023.01)
  H10K 50/115      (2023.01)
  H10K 59/122      (2023.01)
  H10K 50/15       (2023.01)
  H10K 59/126      (2023.01)
  H10K 50/854      (2023.01)
  H10K 59/35       (2023.01)
  H10K 50/16       (2023.01)

(52) U.S. Cl.
  CPC .. *G02F 1/133514* (2013.01); *G02F 1/136209* (2013.01); *H10K 50/115* (2023.02); *H10K 50/15* (2023.02); *H10K 50/16* (2023.02); *H10K 50/17* (2023.02); *H10K 50/171* (2023.02); *H10K 50/8445* (2023.02); *H10K 50/854* (2023.02); *H10K 59/122* (2023.02); *H10K 59/123* (2023.02); *H10K 59/126* (2023.02); *H10K 59/13* (2023.02); *H10K 59/131* (2023.02); *H10K 59/35* (2023.02); *H10K 2102/351* (2023.02)

(58) Field of Classification Search
  CPC .. H10K 59/131; H10K 59/123; H10K 59/122; H10K 59/13; H10K 2105/351; G02F 1/133514; G02F 1/133512; G02F 1/136209
  See application file for complete search history.

(56) References Cited

U.S. PATENT DOCUMENTS

| | | |
|---|---|---|
| 2012/0256201 A1 | 10/2012 | Lee et al. |
| 2015/0221891 A1 | 8/2015 | Ghosh et al. |
| 2018/0047800 A1 | 2/2018 | Choi et al. |
| 2018/0081217 A1* | 3/2018 | Kim ............... G02F 1/133345 |
| 2019/0072818 A1* | 3/2019 | Jung ............... G02F 1/133514 |
| 2019/0121176 A1* | 4/2019 | Lee ................ G02F 1/133617 |
| 2020/0091464 A1* | 3/2020 | Park .................... H10K 59/35 |
| 2020/0258946 A1* | 8/2020 | Kim .................... H10K 59/38 |
| 2021/0043873 A1 | 2/2021 | Sung et al. |

FOREIGN PATENT DOCUMENTS

| | | | | |
|---|---|---|---|---|
| KR | 2019-0076615 A | | 7/2019 | |
| KR | 20190093131 A | | 8/2019 | |
| KR | 20200059369 A | * | 5/2020 | ....... G02F 1/133512 |

* cited by examiner

FIG. 20

|     | 0 hr | 500 hr | 750 hr | 1000 hr |
|-----|------|--------|--------|---------|
| EX1 |      |        | A1     |         |
| EX2 |      |        |        | A2      |
| EX3 |      |        | B      | A3      |

DISPLAY DEVICE INCLUDING SUB-INORGANIC LAYERS

CROSS-REFERENCE TO RELATED APPLICATION

This application claims priority to and the benefit of Korean Patent Application No. 10-2020-0073592, filed on Jun. 17, 2020, the entire disclosure of which is hereby incorporated by reference.

BACKGROUND

1. Field

The present disclosure relates to a display device.

2. Description of the Related Art

Display devices are becoming increasingly important with the development of multimedia. Accordingly, various display devices such as liquid crystal display devices and organic light emitting diode display devices are being developed.

Of the display devices generally available, a self-light emitting display device includes a self-light emitting element such as an organic light emitting diode. The self-light emitting element may include two electrodes facing (e.g., overlapping) each other and a light emitting layer interposed between the two electrodes. When the self-light emitting element is an organic light emitting diode, electrons and holes provided from the two electrodes may be recombined in the light emitting layer to generate excitons. As the generated excitons change from an excited state to a ground state, light may be emitted.

Because self-light emitting display devices do not need a light source such as a backlight unit, they may be low in power consumption; can be made lightweight and thin; and may have a wide viewing angle, high luminance and contrast, and fast response speed. Due to these high-quality characteristics, self-light emitting display devices are drawing attention as next-generation display devices.

SUMMARY

As one way to make each pixel of a display device uniquely display one primary color, a color conversion pattern or a wavelength conversion pattern may be placed in each pixel on a light path extending from a light source to a viewer.

Aspects of the present disclosure are directed towards a display device having improved reliability and light efficiency.

However, aspects of the present disclosure are not restricted to the aspects set forth herein. The above and other aspects of the present disclosure will become more apparent to one of ordinary skill in the art to which the present disclosure pertains by referencing the detailed description of the present disclosure given below.

An embodiment of a display device includes a base; a light emitting element on the base; a capping layer on the light emitting element; a thin-film encapsulation layer including a first inorganic layer on the capping layer, an organic layer on the first inorganic layer, and a second inorganic layer on the organic layer; and a wavelength conversion pattern on the thin-film encapsulation layer and overlapping the light emitting element, wherein the first inorganic layer includes two sub-inorganic layers having different refractive indices.

An embodiment of a display device includes a base; a light emitting element on the base; a thin-film encapsulation layer including a first inorganic layer on the light emitting element, a first organic layer on the first inorganic layer, and a second inorganic layer on the first organic layer; a wavelength conversion pattern on the thin-film encapsulation layer and overlapping the light emitting element; a capping layer on the wavelength conversion pattern; a color filter on the capping layer and overlapping the wavelength conversion pattern; and an upper thin-film encapsulation layer on the color filter and including a third inorganic layer, a second organic layer on the third inorganic layer and a fourth inorganic layer on the second organic layer, wherein the third inorganic layer includes a first sub-inorganic layer on the color filter and a second sub-inorganic layer on the first sub-inorganic layer, and the first sub-inorganic layer is different in refractive index than the second sub-inorganic layer.

BRIEF DESCRIPTION OF THE DRAWINGS

These and/or other aspects will become apparent and more readily appreciated from the following description of some embodiments of the present disclosure, taken in conjunction with the accompanying drawings in which:

FIG. 20 is a view for explaining the reliability of the display device according to the embodiment;

DETAILED DESCRIPTION

Figure 1:
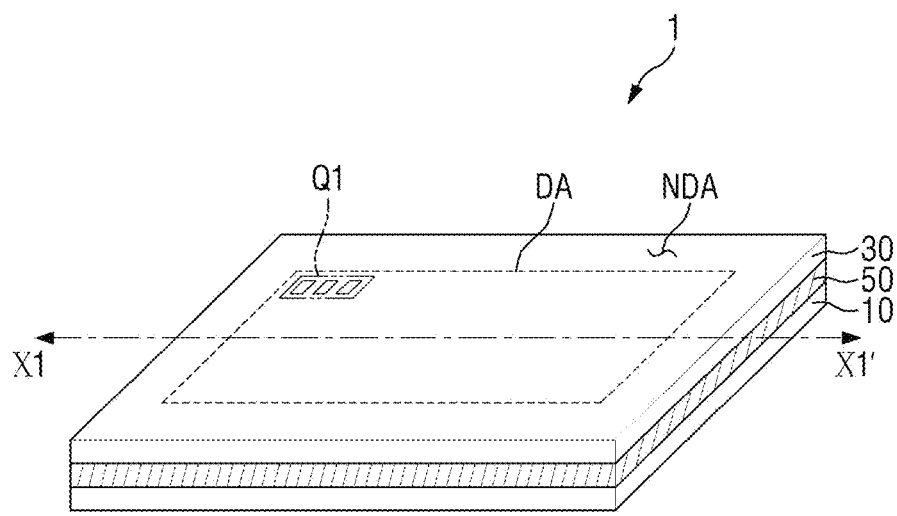
FIG. 1 is a schematic perspective view of a display device according to an embodiment.
Figure 1:
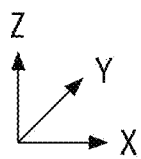

The present disclosure will now be described more fully hereinafter with reference to the accompanying drawings, in which some embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those or ordinary skill in the art. The same reference numbers indicate the same components throughout the specification. In the attached drawings, the thickness of layers and regions is exaggerated for clarity.

The terminology used herein is for the purpose of describing the disclosed embodiments only and is not intended to be limiting of the present disclosure. As used herein, the singular forms "a", "an" and "the" are intended to include the plural forms as well, unless the context clearly indicates otherwise. It will be further understood that the terms "comprises" and "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will also be understood that when a layer is referred to as being "on" another layer or substrate, it can be directly on the other layer or substrate, or one or more intervening layers may also be present. In contrast, when an element is referred to as being "directly on" another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Embodiments are described herein with reference to plan and cross-section illustrations that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. Thus, the regions illustrated in the drawings are schematic in nature and their shapes are not intended to illustrate the actual shape of a region of a device and are not intended to limit the scope of the present disclosure. As used herein, the term "substantially," "about," "approximately," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, embodiments of the present disclosure will be described with reference to the attached drawings. As used herein, the use of the term "may," when describing embodiments of the present disclosure, refers to "one or more embodiments of the present disclosure."

Figure 2A:
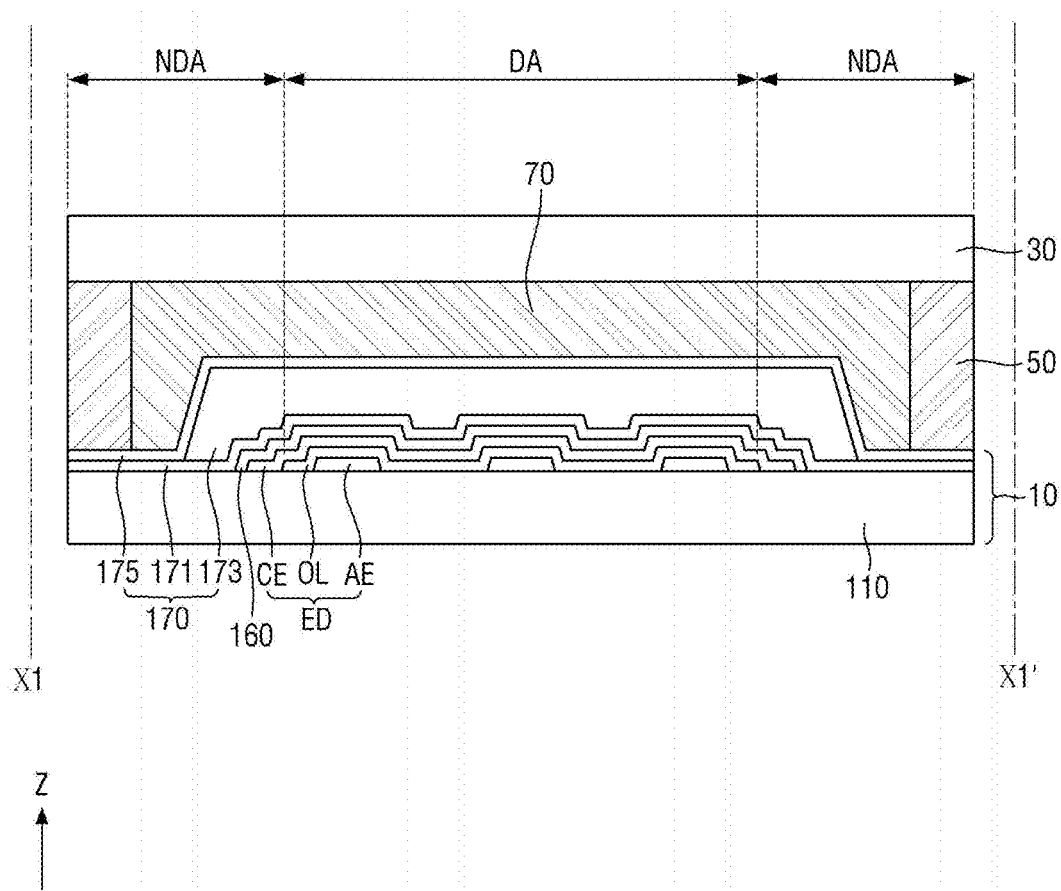
FIG. 2A is a schematic cross-sectional view of the display device, taken along line X1-X1' of FIG. 1.
Figure 2B:
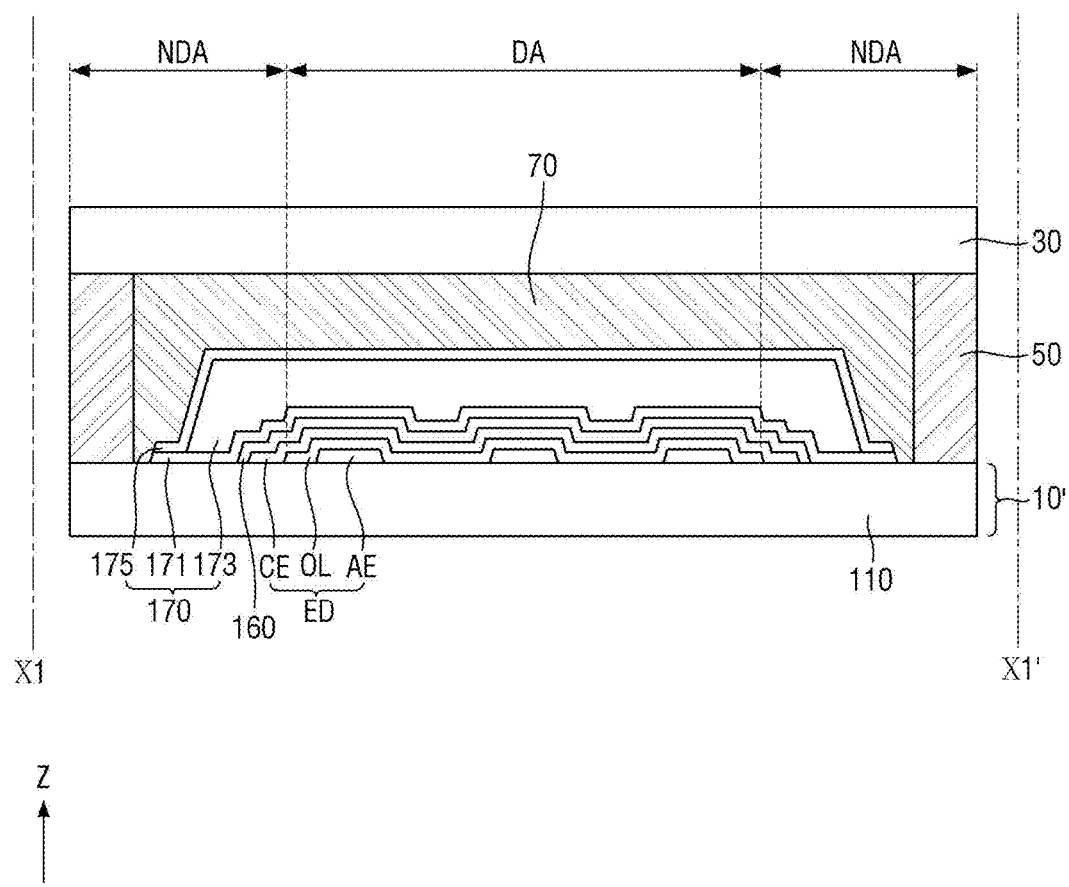
FIG. 2B is a cross-sectional view of a modified example of FIG. 2A.

FIG. 1 is a schematic perspective view of a display device 1 according to an embodiment. FIG. 2A is a schematic cross-sectional view of the display device 1 according to the embodiment, taken along line X1-X1' of FIG. 1. FIG. 2B is a cross-sectional view of a modified example of FIG. 2A.

Referring to FIGS. 1, 2A and 2B, the display device 1 may be applied to various suitable electronic devices including small and medium-sized electronic devices such as tablet personal computers (PCs), smartphones, car navigation units, cameras, center information displays (CIDs) provided in cars, wristwatch-type electronic devices (e.g., wristwatch electronic devices), personal digital assistants (PDAs), portable multimedia players (PMPs) and game machines, and medium and large-sized electronic devices such as televisions, external billboards, monitors, desktop computers integrated with monitors, and notebook computers. However, these are just examples, and the display device 1 can also be employed in other suitable electronic devices without departing from the concept of the present disclosure.

In some embodiments, the display device 1 may be rectangular in a plan view. The display device 1 may include two first sides extending in a first direction X and two second sides extending in a second direction Y intersecting or crossing the first direction X. Corners at which the first and second sides of the display device 1 meet may be rightangled. However, the present disclosure is not limited thereto. For example, the corners may be curved. In some embodiments, lengths of the first sides may be different from lengths of the second sides, but the present disclosure is not limited thereto. The planar shape of the display device 1 is not limited to the above example and may be any suitable shape, such as, for example, a circular shape or other shapes.

The display device 1 may include a display area DA which is to display an image and a non-display area NDA which does not display an image. In some embodiments, the non-display area NDA may be located around the display area DA and, for example, may surround the display area DA. An image displayed in the display area DA may be viewed by a user in a direction in which an arrow in a third direction Z intersecting or crossing the first direction X and the second direction Y points in the drawings. For example, the image may be displayed in (e.g., along or towards) the third direction Z.

As for the schematic stacked structure of the display device 1, in some embodiments, as illustrated in FIG. 2A, the display device 1 includes a display substrate 10 and a color conversion substrate 30 facing (e.g., overlapping) the display substrate 10 and may further include a sealing part 50 bonding the display substrate 10 and the color conversion substrate 30 and a filler 70 in (e.g., filling) a space between the display substrate 10 and the color conversion substrate 30.

The display substrate 10 may include elements and circuits (e.g., pixel circuits such as transistors) for displaying an image, a pixel defining layer defining a light emitting region and a non-light emitting region in the display area DA, and a self-light emitting element. In an example embodiment, the self-light emitting element may include an organic light emitting diode, a quantum dot light emitting diode, an inorganic material-based micro light emitting diode (e.g., a micro LED), and/or an inorganic material-based nano light emitting diode (e.g., a nano LED). For ease of description, the self-light emitting element will be described below as an organic light emitting diode.

A plurality of light emitting regions may be defined in the display area DA of the display substrate 10. For example, as will be described in FIG. 3, a first light emitting region, a second light emitting region, and a third light emitting region may be defined in the display substrate 10. The first light emitting region, the second light emitting region, and the third light emitting region may form one group (e.g., a "light emitting region group"), and a plurality of such light emitting region groups may be defined in the display area DA. A portion of the display substrate 10 which corresponds to part Q1 of FIG. 1 may denote one light emitting region group. In some embodiments, the light emitting region groups may be repeatedly disposed along the first direction X and the second direction Y. For example, the light emitting region groups may be arranged with each other in a matrix pattern in a plane defined by the first direction X and the second direction Y. The first light emitting region, the second light emitting region, and the third light emitting region will be described in more detail later.

As for the schematic stacked structure of the display substrate 10, light emitting elements ED may be located on a first base 110, a first capping layer 160 may be located on the light emitting elements ED to cover the light emitting elements ED, and a thin-film encapsulation layer 170 may be located on the first capping layer 160 to cover the first capping layer 160. The stacked structure of the display substrate 10 will be described later in more detail.

The light emitting elements ED may be located in the display area DA. In some embodiments, the light emitting elements ED may overlap the light emitting regions, respectively. Each of the light emitting elements ED may include an anode AE, a light emitting layer OL located on the anode AE, and a cathode CE located on the light emitting layer OL. In some embodiments, a portion of the cathode CE may also be located in the non-display area NDA. For example, that cathode CE may be a common electrode to correspond to multiple light emitting elements ED. The anode AE, the light emitting layer OL, and the cathode CE will be described in more detail later.

The first capping layer 160 may be located on the cathode CE. In some embodiments, the first capping layer 160 may be disposed over the display area DA and the non-display area NDA and may cover the light emitting elements ED. In some embodiments, ends of the first capping layer 160 may be located relatively further out than ends of the cathode CE, and the first capping layer 160 may cover the cathode CE.

In some embodiments, the ends of the first capping layer 160 may be located relatively further in than the sealing part 50 and may be spaced apart from the sealing part 50. The first capping layer 160 will be described in more detail later.

The thin-film encapsulation layer 170 may be located on the first capping layer 160. In some embodiments, the thin-film encapsulation layer 170 may be disposed over the display area DA and the non-display area NDA and may completely cover the first capping layer 160.

In some embodiments, the thin-film encapsulation layer 170 may include a first lower inorganic layer 171 located on the first capping layer 160, a first organic layer 173 located on the first lower inorganic layer 171, and a first upper inorganic layer 175 located on the first organic layer 173. In some embodiments, ends of the first lower inorganic layer 171 and ends of the first upper inorganic layer 175 may be located relatively further out than ends of the first organic layer 173, and the first lower inorganic layer 171 and the first upper inorganic layer 175 may contact each other in the non-display area NDA.

In some embodiments, ends of the thin-film encapsulation layer 170 may be located relatively further out than the ends of the first capping layer 160. For example, the ends of the first lower inorganic layer 171 and the ends of the first upper inorganic layer 175 may be located relatively further out than the ends of the first capping layer 160, and the first lower inorganic layer 171 and the first upper inorganic layer 175 may completely cover the first capping layer 160. Accordingly, it is possible to prevent or block moisture and/or oxygen from penetrating into the first capping layer 160 and denaturing the first capping layer 160.

The thin-film encapsulation layer 170 will be described in more detail later.

The color conversion substrate 30 may be located on the display substrate 10 and may face (e.g., overlap) the display substrate 10. In some embodiments, the color conversion substrate 30 may include a color conversion pattern that converts the color of incident light. In some embodiments, the color conversion substrate 30 may include a color filter and/or a wavelength conversion pattern as the color conversion pattern. In some embodiments, the color conversion substrate 30 may include both the color filter and the wavelength conversion pattern.

In the display area DA, a plurality of light transmitting regions may be defined in the color conversion substrate 30. For example, as will be described in FIG. 4, a first light transmitting region, a second light transmitting region, and a third light transmitting region may be defined in the color conversion substrate 30. The first light transmitting region, the second light transmitting region, and the third light transmitting region may form one group (e.g., a "light transmitting region group"), and a plurality of such light transmitting region groups may be defined in the display area DA. A portion of the color conversion substrate 30 which corresponds to part Q1 of FIG. 1 may denote one light transmitting region group. In some embodiments, the light transmitting groups may be repeatedly disposed along the first direction X and the second direction Y and may be disposed to correspond to the light emitting region groups. The first light transmitting region, the second light transmitting region, and the third light transmitting region will be described in more detail later.

The sealing part 50 may be located between the display substrate 10 and the color conversion substrate 30 in the non-display area NDA. The sealing part 50 may be disposed in the non-display area NDA along edges of the display substrate 10 and of the color conversion substrate 30 to be around (e.g., surround) the display area DA in the plan view. The display substrate 10 and the color conversion substrate 30 may be bonded to each other by the sealing part 50.

In some embodiments, the sealing part 50 may be made of an organic material. For example, the sealing part 50 may be made of, but is not limited to, epoxy resin.

In some embodiments, the sealing part 50 may overlap the thin-film encapsulation layer 170 of the display substrate 10. For example, as illustrated in FIG. 2A, the sealing part 50 may be located between the thin-film encapsulation layer 170 and the color conversion substrate 30 in the non-display area NDA. In some embodiments, the sealing part 50 may directly contact the thin-film encapsulation layer 170. For example, as illustrated in FIG. 2A, the sealing part 50 may overlap the first lower inorganic layer 171 and the first upper inorganic layer 175 of the thin-film encapsulation layer 170 and may directly contact the first upper inorganic layer 175.

However, the present disclosure is not limited thereto. For example, the relationship between the sealing part 50 and the thin-film encapsulation layer 170 may be in accordance with the embodiment illustrated in FIG. 2B. For example, as illustrated in FIG. 2B, a sealing part 50 of a display substrate 10' may not overlap a thin-film encapsulation layer 170. For example, as illustrated in FIG. 2B, ends of the thin-film encapsulation layer 170 may be located relatively further in than the sealing part 50, and the thin-film encapsulation layer 170 and the sealing part 50 may not overlap each other.

A case where the display substrate 10 has the structure illustrated in FIG. 2A will be described below as an example. However, the present disclosure is not limited thereto. For example, the relationship between the sealing part 50 and the thin-film encapsulation layer 170 on a display substrate of embodiments to be described later can also be in accordance with the embodiment illustrated in FIG. 2B.

The filler 70 may be located in the space between the display substrate 10 and the color conversion substrate 30 and surrounded (e.g., partially or entirely surrounded) by the sealing part 50. The filler 70 may fill the space between the display substrate 10 and the color conversion substrate 30.

In some embodiments, the filler 70 may be made of a material capable of transmitting light. In some embodiments, the filler 70 may be made of an organic material. For example, the filler 70 may be made of a silicon-based organic material, an epoxy-based organic material, or a mixture of a silicon-based organic material and an epoxy-based organic material.

In some embodiments, the filler 70 may be made of a material having an extinction coefficient of substantially zero. A refractive index (index of refraction) and an extinction coefficient are correlated, and the extinction coefficient decreases as the refractive index decreases. In addition, when the refractive index is 1.7 or less, the extinction coefficient may converge to substantially zero. In some embodiments, the filler 70 may be made of a material having a refractive index of 1.7 or less. Accordingly, light provided by the self-light emitting element can be prevented from being transmitted through and absorbed by the filler 70, or the absorption of the light may be reduced or minimized. For example, light provided by the self-light emitting element and transmitting through the filler 70 may be prevented from being absorbed by the filler 70, or the absorption of the light may be reduced or minimized, as the light transmits through the filler 70. In some embodiments, the filler 70 may be made of an organic material having a refractive index of 1.4 to 1.6.

Figure 3:
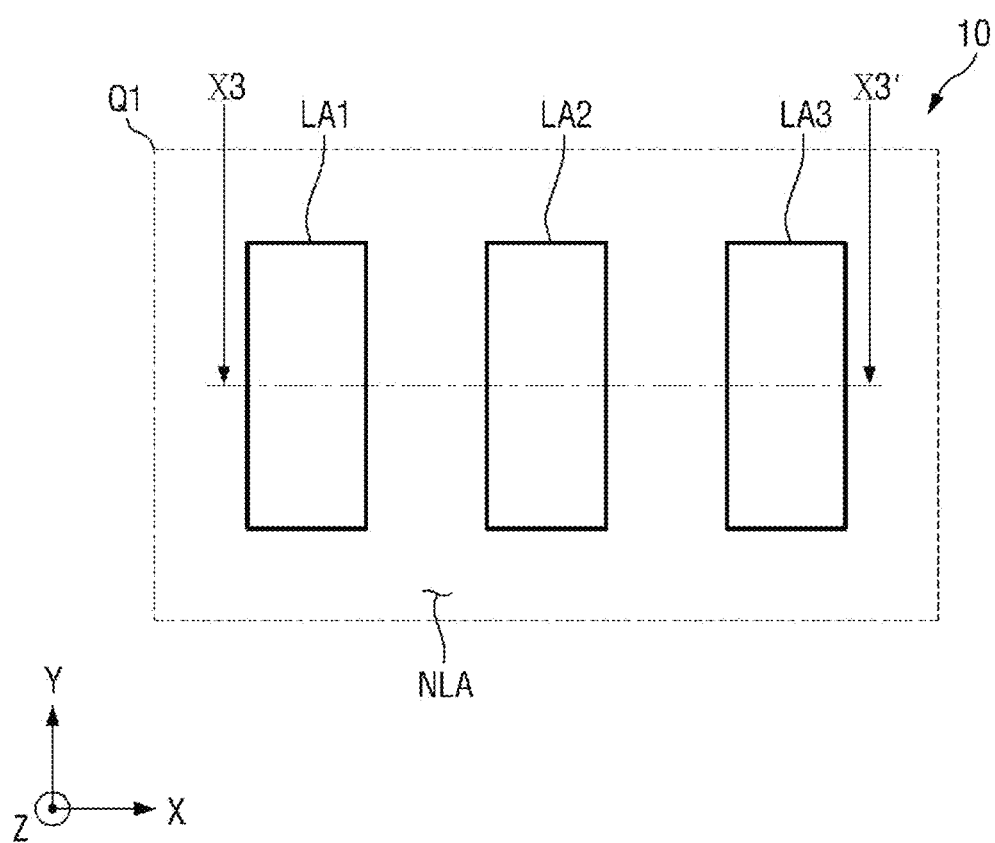
FIG. 3 is an enlarged plan view of part Q1 of FIG. 1, more specifically, a schematic plan view of a display substrate included in the display device of FIG. 1.
Figure 4:
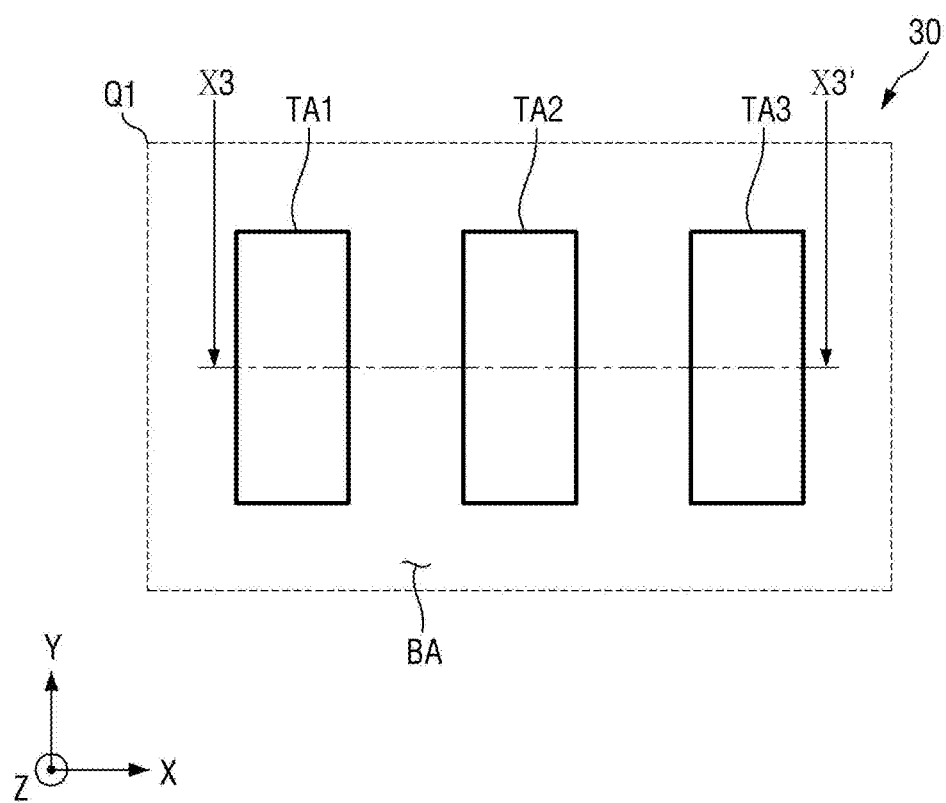
FIG. 4 is an enlarged plan view of part Q1 of FIG. 1, more specifically, a schematic plan view of a color conversion substrate included in the display device of FIG. 1.
Figure 5:
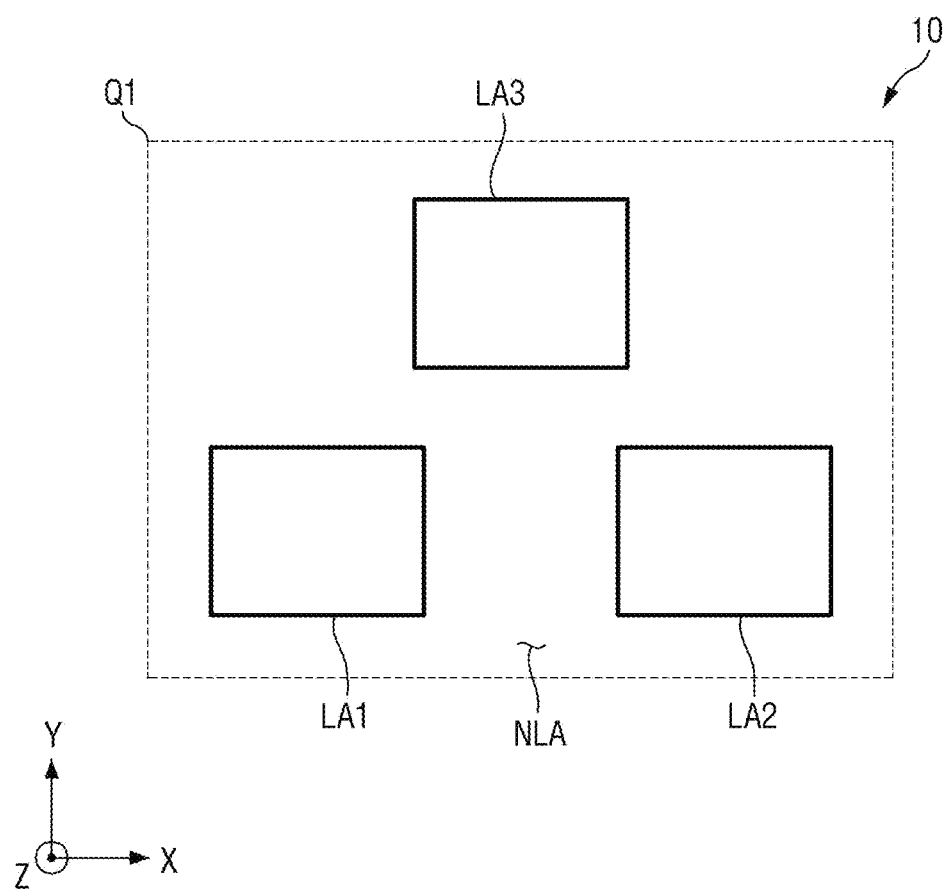
FIG. 5 is a plan view of a modified example of FIG. 3.
Figure 6:
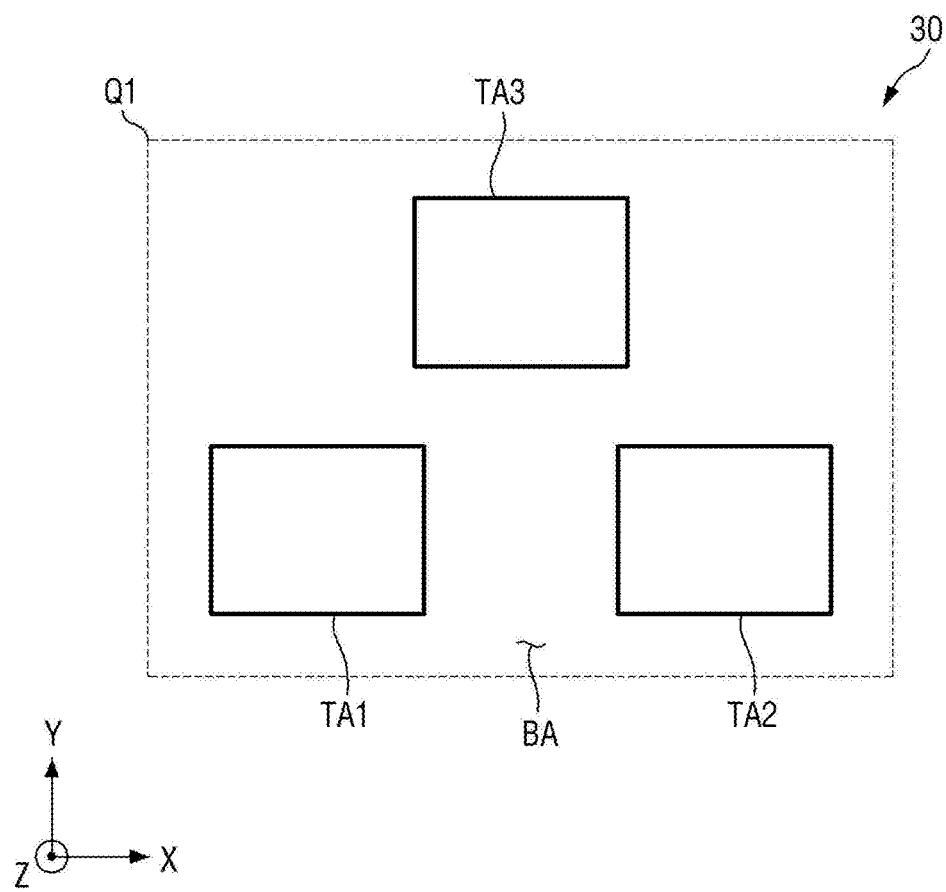
FIG. 6 is a plan view of a modified example of FIG. 4.

FIG. 3 is an enlarged plan view of part Q1 of FIG. 1, more specifically, a schematic plan view of the display substrate 10 included in the display device 1 of FIG. 1. FIG. 4 is an enlarged plan view of part Q1 of FIG. 1, more specifically, a schematic plan view of the color conversion substrate 30 included in the display device 1 of FIG. 1. FIG. 5 is a plan view of a modified example of FIG. 3. FIG. 6 is a plan view of a modified example of FIG. 4.

Referring to FIGS. 3 through 6 in addition to FIGS. 1 and 2A, a plurality of light emitting regions and a non-light emitting region NLA may be defined in the display substrate 10 in the display area DA. In some embodiments, a first light emitting region LA1, a second light emitting region LA2, and a third light emitting region LA3 may be defined in the display area DA of the display substrate 10. Each of the first light emitting region LA1, the second light emitting region LA2, and the third light emitting region LA3 may be a region where light generated by a light emitting element of the display substrate 10 is emitted out of the display substrate 10, and the non-light emitting region NLA may be a region where light is not emitted out of the display substrate 10.

In some embodiments, light emitted from the first light emitting region LA1, the second light emitting region LA2, and the third light emitting region LA3 may be light of a third color. In some embodiments, the light of the third color may be blue light and may have a peak wavelength in the range of about 440 nm to about 480 nm.

In some embodiments, the first light emitting region LA1, the second light emitting region LA2 and the third light emitting region LA3 may form one group, and a plurality of such groups may be defined in the display area DA.

In some embodiments, the first light emitting region LA1, the second light emitting region LA2, and the third light emitting region LA3 may be sequentially located along the first direction X as illustrated in FIG. 3. In some embodiments, the first light emitting region LA1, the second light emitting region LA2, and the third light emitting region LA3 forming one group may be repeatedly arranged in the display area DA along the first direction X and the second direction Y.

However, the present disclosure is not limited thereto, and the arrangement of the first light emitting region LA1, the second light emitting region LA2, and the third light emitting region LA3 can be changed variously and suitably. For example, as illustrated in FIG. 5, the first light emitting region LA1 and the second light emitting region LA2 may neighbor each other along the first direction X, and the third light emitting region LA3 may be located on a side (e.g., an upper side) of the first light emitting region LA1 and the second light emitting region LA2 along the second direction Y.

A case where the first light emitting region LA1, the second light emitting region LA2, and the third light emitting region LA3 are arranged as illustrated in FIG. 3 will be described below as an example.

In some embodiments, the non-display area NDA of the display substrate 10 may be located around the display area DA and, for example, may surround the display area DA.

A plurality of light transmitting regions and a light blocking region BA may be defined in the color conversion substrate 30 in the display area DA. Each of the light transmitting regions may be a region where light emitted from the display substrate 10 is transmitted through the color conversion substrate 30 and provided to the outside of the display device 1. The light blocking region BA may be a region through which light emitted from the display substrate 10 is not transmitted (e.g., is blocked).

In some embodiments, a first light transmitting region TA1, a second light transmitting region TA2 and a third light transmitting region TA3 may be defined in the color conversion substrate 30.

The first light transmitting region TA1 may correspond to the first light emitting region LA1 and/or may overlap the first light emitting region LA1. Similarly, the second light transmitting region TA2 may correspond to and/or overlap the second light emitting region LA2, and the third light transmitting region TA3 may correspond to and/or overlap the third light emitting region LA3.

In some embodiments, when the first light emitting region LA1, the second light emitting region LA2, and the third light emitting region LA3 are sequentially located (e.g., arranged) along the first direction X as illustrated in FIG. 3, the first light transmitting region TA1, the second light transmitting region TA2, and the third light transmitting region TA3 may be sequentially located (e.g., arranged) along the first direction X as illustrated in FIG. 4.

In some embodiments, when the first light emitting region LA1 and the second light emitting region LA2 neighbor each other along the first direction X and the third light emitting region LA3 is located on a side (e.g., an upper side) of the first light emitting region LA1 and the second light emitting region LA2 along the second direction Y as illustrated in FIG. 5, the first light transmitting region TA1 and the second light emitting region TA2 may neighbor each other along the first direction X, and the third light transmitting region TA3 may be located on a side (e.g., an upper side) of the first light transmitting region TA1 and the second light transmitting region TA2 along the second direction Y as illustrated in FIG. 6.

In some embodiments, light of the third color provided by the display substrate 10 may be emitted out of the display device 1 through the first light transmitting region TA1, the second light transmitting region TA2, and the third light transmitting region TA3. When light emitted out of the display device 1 in the first light transmitting region TA1 is referred to as first output light, light emitted out of the display device 1 in the second light transmitting region TA2 is referred to as second output light, and light emitted out of the display device 1 in the third light transmitting region TA3 is referred to as third output light, the first output light may be light of a first color, the second output light may be light of a second color different from the first color, and the third output light may be light of the third color. In some embodiments, the light of the third color may be blue light having a peak wavelength in the range of about 440 nm to about 480 nm as described above, and the light of the first color may be red light having a peak wavelength in the range of about 610 nm to about 650 nm. In addition, the light of the second color may be green light having a peak wavelength in the range of about 510 nm to about 550 nm.

The light blocking region BA may be located around the first light transmitting region TA1, the second light transmitting region TA2, and the third light transmitting region TA3 of the color conversion substrate 30 in the display area DA. In some embodiments, the light blocking region BA may be around (e.g., surround) the first light transmitting region TA1, the second light transmitting region TA2, and the third light transmitting region TA3.

The structure of the display device 1 will now be described in more detail.

Figure 7:
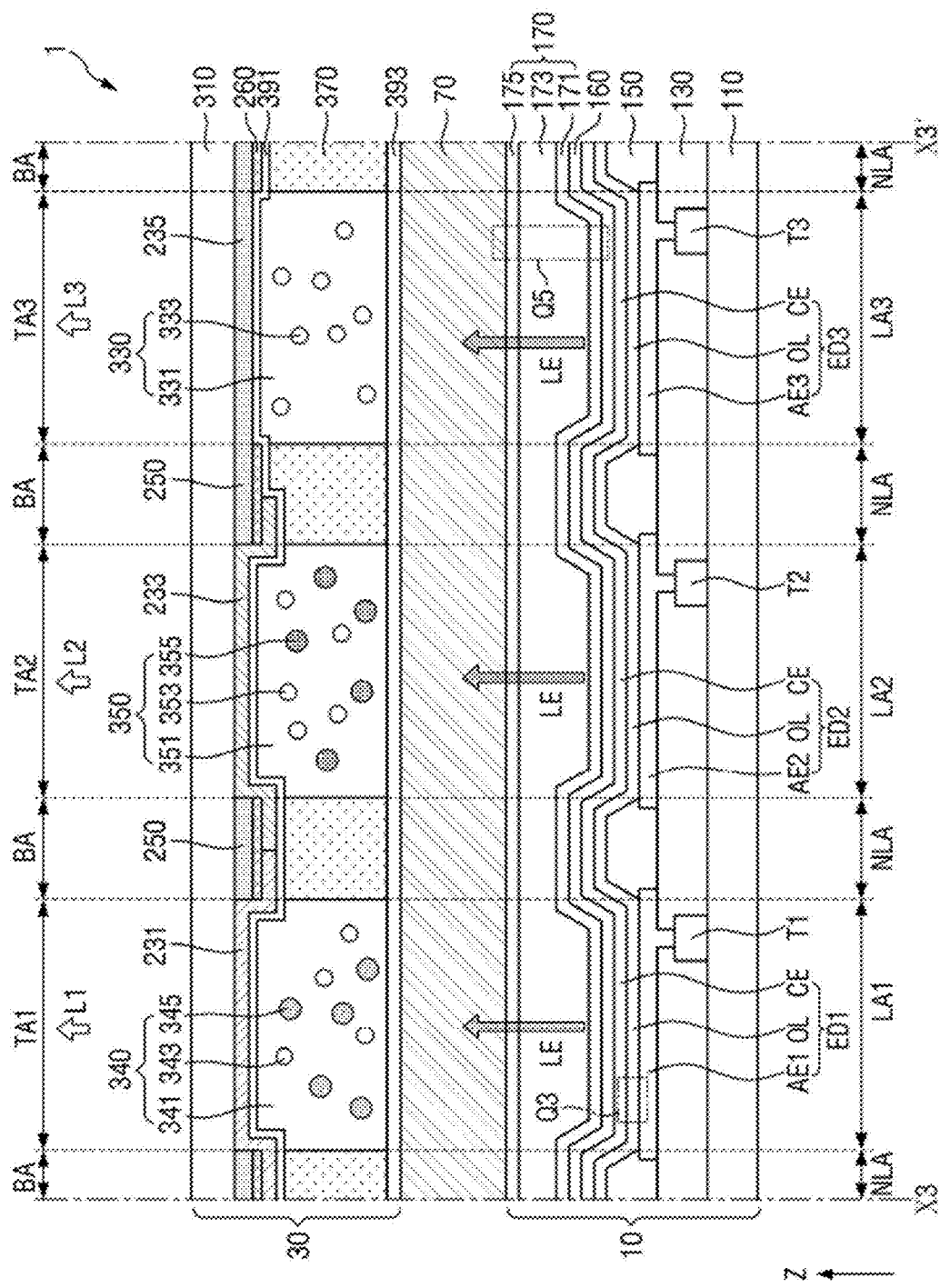
FIG. 7 is a cross-sectional view of the display device according to the embodiment, taken along line X3-X3' of FIGS. 3 and 4.
Figure 8:
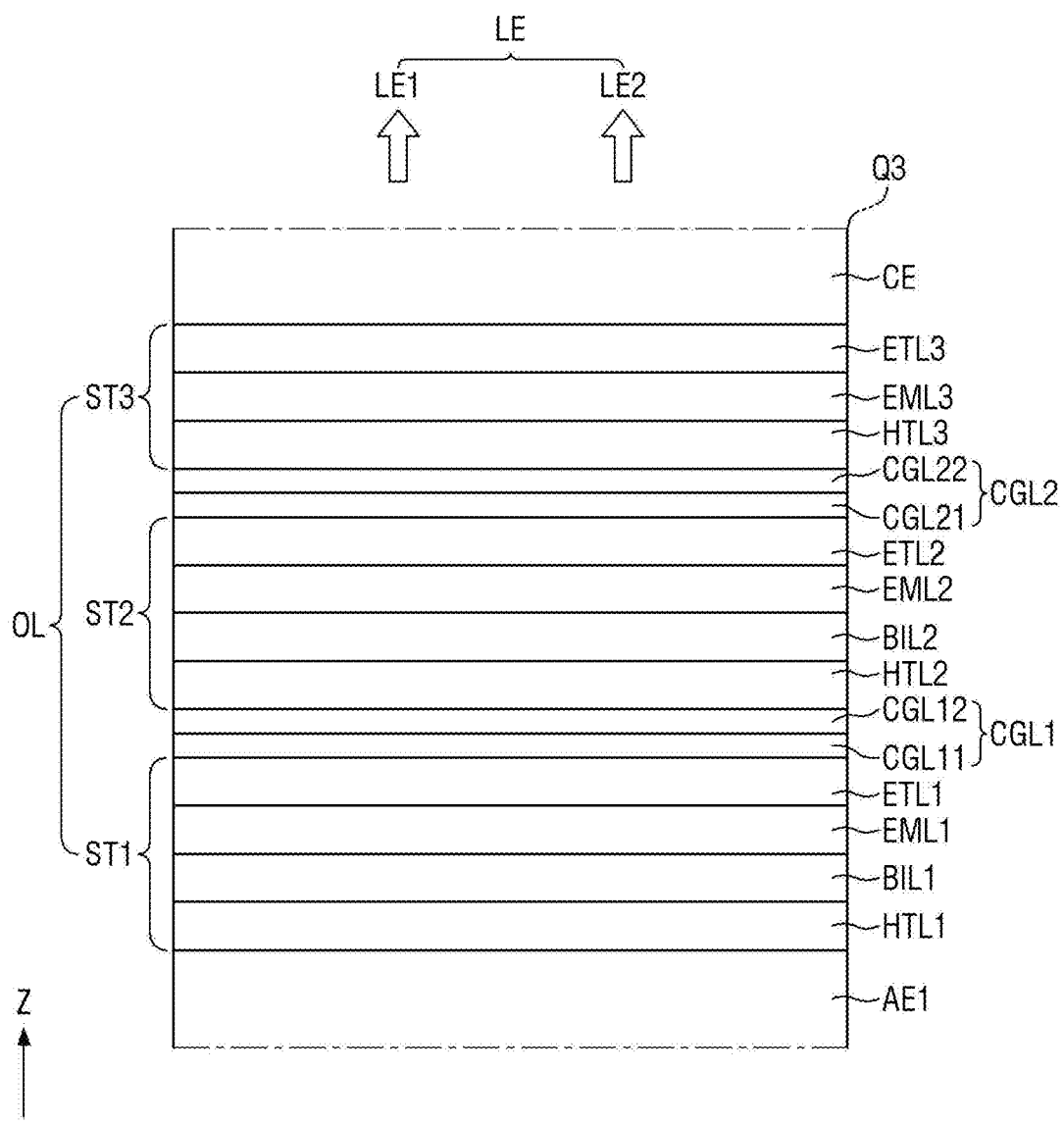
FIG. 8 is an enlarged cross-sectional view of part Q3 of FIG. 7.
Figure 9:
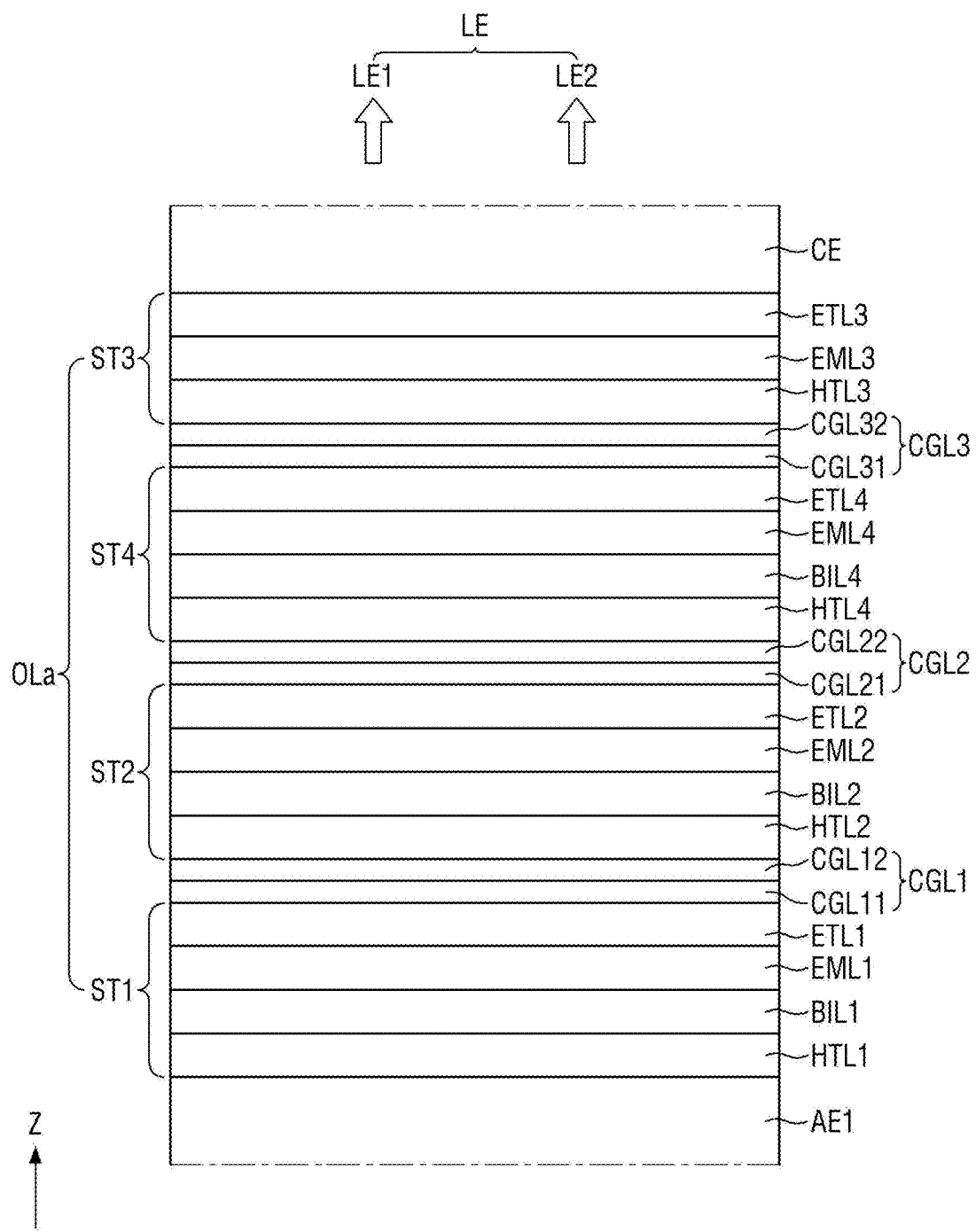
FIG. 9 is a cross-sectional view of a modified example of the structure illustrated in FIG. 8.
Figure 10:
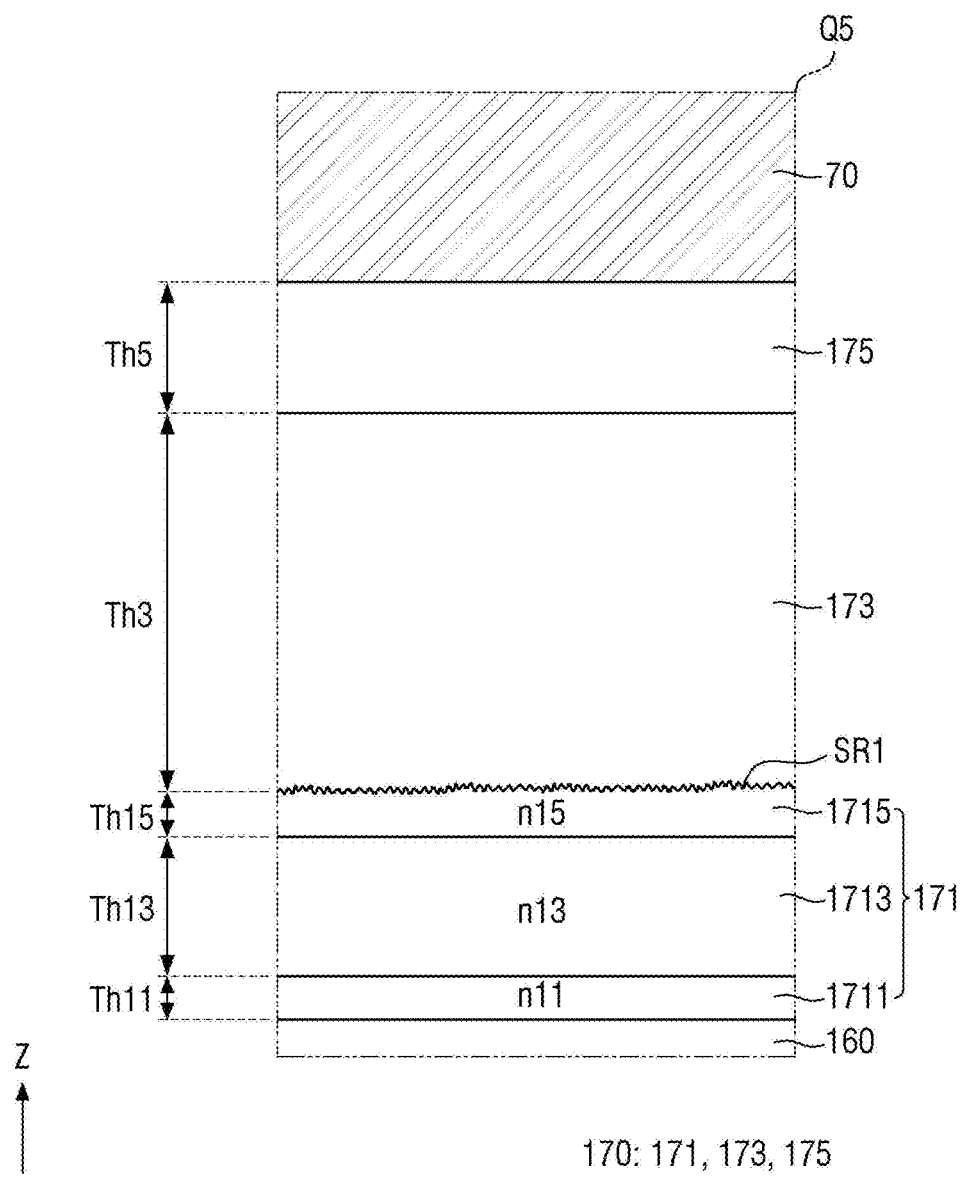
FIG. 10 is an enlarged cross-sectional view of part Q5 of FIG. 7.
Figure 11:
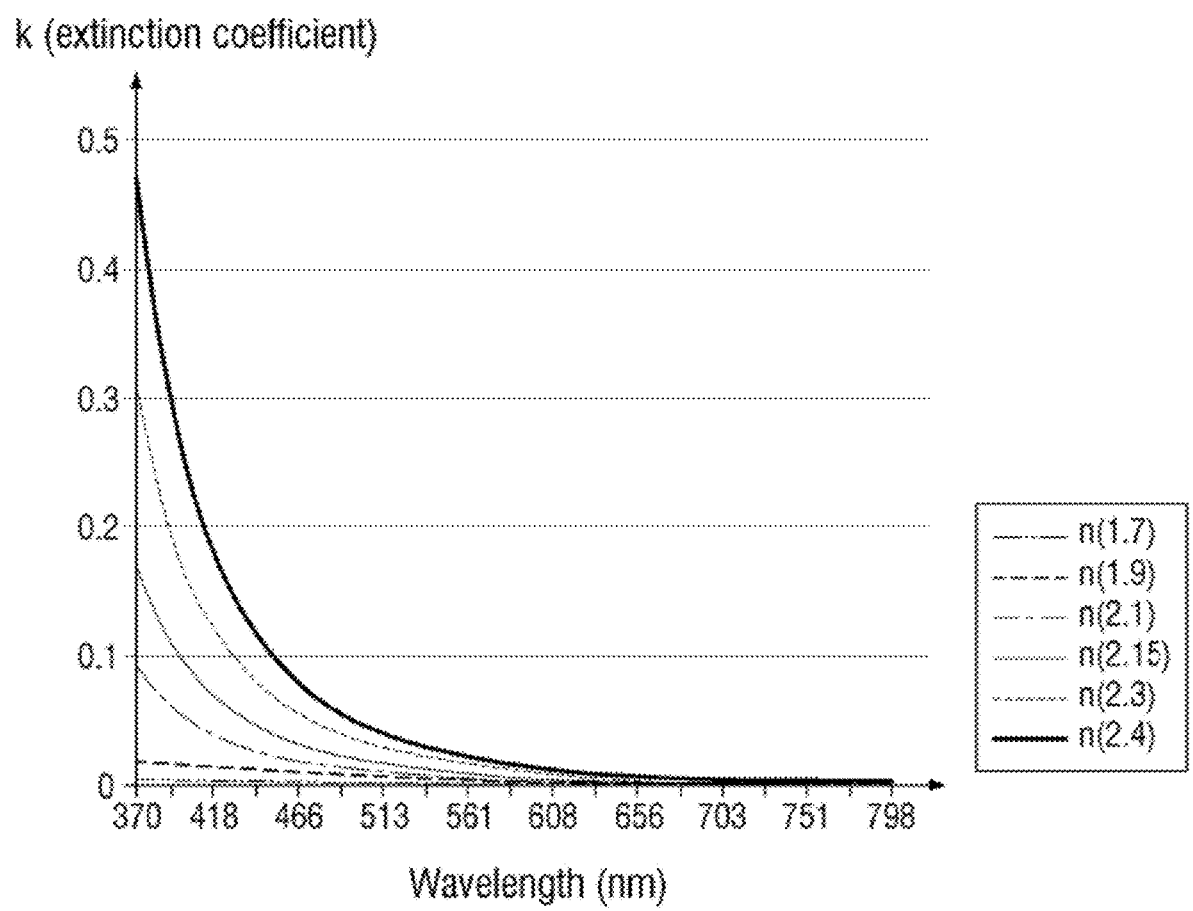
FIG. 11 is a graph illustrating the change in extinction coefficient according to the change in refractive index.

FIG. 7 is a cross-sectional view of the display device 1 according to the embodiment, taken along line X3-X3' of FIGS. 3 and 4. FIG. 8 is an enlarged cross-sectional view of part Q3 of FIG. 7. FIG. 9 is a cross-sectional view of a modified example of the structure illustrated in FIG. 8. FIG. 10 is an enlarged cross-sectional view of part Q5 of FIG. 7. FIG. 11 is a graph illustrating the change in extinction coefficient according to the change in refractive index.

Referring to FIGS. 7 through 11 in addition to FIGS. 1 and 2A, the display device 1 may include the display substrate 10 and the color conversion substrate 30 as described above and may further include the filler 70 located between the display substrate 10 and the color conversion substrate 30.

The display substrate 10 will now be described.

The first base 110 may be made of a light transmitting material. In some embodiments, the first base 110 may be a glass substrate and/or a plastic substrate. When the first base 110 is a plastic substrate, it may have suitable flexibility. In some embodiments, the first base 110 may further include a separate layer located on the glass substrate and/or the plastic substrate, for example, a buffer layer or an insulating layer.

In some embodiments, the first through third light emitting regions LA1 through LA3 and the non-light emitting region NLA may be defined in the first base 110 as described above.

As illustrated in FIG. 7, transistors T1 through T3 may be located on the first base 110. In some embodiments, each of the transistors T1 through T3 may be a thin-film transistor. In some embodiments, a first transistor T1 may overlap the first light emitting region LA1, a second transistor T2 may overlap the second light emitting region LA2, and a third transistor T3 may overlap the third light emitting region LA3. Although the first transistor T1, the second transistor T2 and the third transistor T3 overlap the light emitting regions LA and do not overlap the non-light emitting region NLA in the drawing, this is merely an example. In an embodiment, at least one selected from the first transistor T1, the second transistor T2, and the third transistor T3 may overlap the non-light emitting region NLA. In some embodiments, all of the first transistor T1, the second transistor T2 and the third transistor T3 overlap the non-light emitting region NLA and do not overlap the light emitting regions LA.

A plurality of signal lines (e.g., gate lines, data lines, and/or power lines) for transmitting signals to each transistor may be further located on the first base 110.

An insulating layer 130 may be located on the first transistor T1, the second transistor T2, and the third transistor T3. In some embodiments, the insulating layer 130 may be a planarization layer. In some embodiments, the insulating layer 130 may include (e.g., be) an organic material. For example, the insulating layer 130 may include (e.g., be) acrylic resin, epoxy resin, imide resin, and/or ester resin. In some embodiments, the insulating layer 130 may include (e.g., be) a photosensitive organic material.

A first anode AE1, a second anode AE2 and a third anode AE3 may be located on the insulating layer 130.

The first anode AE1 may overlap the first light emitting region LA1, and at least a portion of the first anode AE1 may extend to the non-light emitting region NLA. The second anode AE2 may overlap the second light emitting region LA2, and at least a portion of the second anode AE2 may extend to the non-light emitting region NLA. The third anode AE3 may overlap the third light emitting region LA3, and at least a portion of the third anode AE3 may extend to the non-light emitting region NLA. The first anode AE1 may penetrate the third insulating layer 130 and may be coupled (e.g., connected) to the first transistor T1, the second anode AE2 may penetrate the third insulating layer 130 and may be coupled (e.g., connected) to the second transistor T2, and the third anode AE3 may penetrate the third insulating layer 130 and may be coupled (e.g., connected) to the third transistor T3. For example, the first through third anodes AE1 through AE3 may be respectively coupled (e.g., connected) to the first through third transistors T1 through T3 through respective contact holes in the insulating layer 130.

In some embodiments, the first anode AE1, the second anode AE2, and the third anode AE3 may be reflective electrodes. In this case, each of the first anode AE1, the second anode AE2, and the third anode AE3 may be a metal layer including (e.g., being) a metal such as silver (Ag), magnesium (Mg), aluminum (Al), platinum (Pt), palladium (Pd), gold (Au), nickel (Ni), neodymium (Nd), iridium (Ir) and/or chromium (Cr). In an embodiment, each of the first anode AE1, the second anode AE2, and the third anode AE3 may further include a metal oxide layer stacked on the metal layer. In an example embodiment, each of the first anode AE1, the second anode AE2, and the third anode AE3 may have a multilayer structure such as a two-layer structure of ITO/Ag, Ag/ITO, ITO/Mg or ITO/MgF$_2$ or a three-layer structure of ITO/Ag/ITO.

A pixel defining layer 150 may be located on the first anode AE1, the second anode AE2, and the third anode AE3. For example, the pixel defining layer 150 may cover a part (e.g., an edge) of the first anode AE1, the second anode AE2, and the third anode AE3. The pixel defining layer 150 may have an opening exposing the first anode AE1 (e.g., a center portion of the first anode AE1), an opening exposing the second anode AE2 (e.g., a center portion of the second anode AE2) and an opening exposing the third anode AE3 (e.g., a center portion of the third anode AE3) and may define the first light emitting region LA1, the second light emitting region LA2, the third light emitting region LA3 and the non-light emitting region NLA. For example, a region of the first anode AE1 which is exposed without being covered by the pixel defining layer 150 may be the first light emitting region LA1. Similarly, a region of the second anode AE2 which is exposed without being covered by the pixel defining layer 150 may be the second light emitting region LA2, and a region of the third anode AE3 which is exposed without being covered by the pixel defining layer 150 may be the third light emitting region LA3. In addition, a region where the pixel defining layer 150 is located may be the non-light emitting region NLA.

In some embodiments, the pixel defining layer 150 may include (e.g., be) an organic insulating material such as polyacrylates resin, epoxy resin, phenolic resin, polyamides resin, polyimides resin, unsaturated polyesters resin, polyphenylene ethers resin, polyphenylene sulfides resin and/or benzocyclobutene (BCB).

In some embodiments, the pixel defining layer 150 may overlap a color pattern 250 to be described later. In addition, the pixel defining layer 150 may further overlap a first color filter 231 and a second color filter 233.

In some embodiments, the pixel defining layer 150 may also overlap a bank pattern 370 to be described later.

As illustrated in FIG. 7, the light emitting layer OL may be located on the first anode AE1, the second anode AE2, and the third anode AE3.

In some embodiments, the light emitting layer OL may be in the shape of a continuous layer formed over the light emitting regions LA1 through LA3 and the non-light emitting region NLA. For example, the light emitting layer OL may be a common layer. The light emitting layer OL will be described in more detail later.

As illustrated in FIG. 7, the cathode CE may be located on the light emitting layer OL.

In some embodiments, the cathode CE may have translucency or transparency. When the cathode CE has translucency, it may include (e.g., be) Ag, Mg, copper (Cu), Al, Pt, Pd, Au, Ni, Nd, Ir, Cr, lithium (Li), calcium (Ca), LiF/Ca, LiF/Al, molybdenum (Mo), titanium (Ti), or a compound or mixture of the same (e.g., a mixture of Ag and Mg). In addition, when a thickness of the cathode CE is tens to hundreds of angstroms, the cathode CE may have translucency.

When the cathode CE has transparency, it may include (e.g., be) a transparent conductive oxide (TCO). For example, the cathode CE may include (e.g., be) tungsten oxide WxOy ($W_xO_y$), titanium oxide (TiO$_2$), indium tin oxide (ITO), indium zinc oxide (IZO), zinc oxide (ZnO), indium tin zinc oxide (ITZO), and/or magnesium oxide (MgO).

The first anode AE1, the light emitting layer OL and the cathode CE may constitute a first light emitting element ED1, the second anode AE2, the light emitting layer OL and the cathode CE may constitute a second light emitting element ED2, and the third anode AE3, the light emitting layer OL and the cathode CE may constitute a third light emitting element ED3. Each of the first light emitting element ED1, the second light emitting element ED2, and the third light emitting element ED3 may emit output light LE, and the output light LE may be provided to the color conversion substrate 30.

As illustrated in FIG. 8, the output light LE finally emitted from the light emitting layer OL may be a mixture of a first component LE1 and a second component LE2. Each of the first component LE1 and the second component LE2 in the output light LE may have a peak wavelength of (e.g., peak wavelength in the range of) 440 nm to less than 480 nm (e.g., equal to or greater than 440 nm and less than 480 nm). For example, the output light LE may be blue light.

As illustrated in FIG. 8, in some embodiments, the light emitting layer OL may have a structure in which a plurality of light emitting layers overlap, for example, may have a tandem structure. For example, the light emitting layer OL may include a first stack ST1 including a first light emitting layer EML1, a second stack ST2 located on the first stack ST1 and including a second light emitting layer EML2, a third stack ST3 located on the second stack ST2 and including a third light emitting layer EML3, a first charge generation layer CGL1 located between the first stack ST1 and the second stack ST2, and a second charge generation layer CGL2 located between the second stack ST2 and the third stack ST3. The first stack ST1, the second stack ST2, and the third stack ST3 may overlap each other.

The first light emitting layer EML1, the second light emitting layer EML2, and the third light emitting layer EML3 may overlap each other.

In some embodiments, the first light emitting layer EML1, the second light emitting layer EML2 and the third light emitting layer EML3 may each emit light of the third color, for example, blue light. For example, each of the first light emitting layer EML1, the second light emitting layer EML2 and the third light emitting layer EML3 may be a blue light emitting layer and may include (e.g., be) an organic material. However, the present disclosure is not limited thereto. In an embodiment, at least one selected from the first light emitting layer EML1, the second light emitting layer EML2 and the third light emitting layer EML3 may include (e.g., be) an inorganic material that emits blue light. For example, at least one selected from the first light emitting layer EML1, the second light emitting layer EML2 and the third light emitting layer EML3 may be made of an inorganic material-based light emitting element or may be a portion of the inorganic material-based light emitting element. In some embodiments, the inorganic material-based light emitting element may be an inorganic light emitting element having a nano-sized width.

In some embodiments, at least one selected from the first light emitting layer EML1, the second light emitting layer EML2 and the third light emitting layer EML3 may emit first blue light having a first peak wavelength, and at least another one selected from the first light emitting layer EML1, the second light emitting layer EML2 and the third light emitting layer EML3 may emit second blue light having a second peak wavelength different from the first peak wavelength. For example, any one selected from the first light emitting layer EML1, the second light emitting layer EML2 and the third light emitting layer EML3 may emit the first blue light having the first peak wavelength, and the other two selected from the first light emitting layer EML1, the second light emitting layer EML2 and the third light emitting layer EML3 may emit the second blue light having the second peak wavelength. For example, the output light LE finally emitted from the light emitting layer OL may be a mixture of the first component LE1 and the second component LE2, the first component LE1 may be the first blue light having the first peak wavelength, and the second component LE2 may be the second blue light having the second peak wavelength.

In some embodiments, any one selected from the first peak wavelength and the second peak wavelength may be in the range of 440 nm to less than 460 nm (e.g., equal to or greater than 440 nm and less than 460 nm). The other one selected from the first peak wavelength and the second peak wavelength may be in the range of 460 nm to 480 nm. However, the range of the first peak wavelength and the range of the second peak wavelength are not limited to this example. For example, the range of the first peak wavelength and the range of the second peak wavelength may each include 460 nm. In some embodiments, any one selected from the first blue light and the second blue light may be light of a deep blue color, and the other one selected from the first blue light and the second blue light may be light of a sky blue color.

According to some embodiments, the output light LE emitted from the light emitting layer OL is blue light and may include a long wavelength component and a short wavelength component. Therefore, the light emitting layer OL may finally (e.g., the first through third light emitting layers EML1 through EML3 may collectively) emit blue light having a broader emission peak as the output light LE, thereby improving color visibility at a side viewing angle compared with a conventional light emitting element that emits blue light having a sharp emission peak.

In some embodiments, each of the first light emitting layer EML1, the second light emitting layer EML2 and the third light emitting layer EML3 may include (e.g., be) a host and a dopant. The host is not particularly limited as long as it is a commonly utilized or generally available material. For example, tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), and/or 2-methyl-9,10-bis(naphthalen-2-yl)anthracene) (MADN) may be utilized.

Each of the first light emitting layer EML1, the second light emitting layer EML2 and the third light emitting layer EML3 which emit blue light may include (e.g., be), for example, a fluorescent material containing spiro-DPVBi, spiro-6P, distyryl-benzene (DSB), distyryl-arylene (DSA), a polyfluorene (PFO)-based polymer, and/or a poly (p-phenylene vinylene) (PPV)-based polymer. In some embodiments, a phosphorescent material containing an organometallic complex such as (4,6-F2ppy)2Irpic may be included. However, the material that emits blue light is not limited to the above examples.

As described above, at least one selected from the first light emitting layer EML1, the second light emitting layer EML2 and the third light emitting layer EML3, and at least another one selected from the first light emitting layer EML1, the second light emitting layer EML2 and the third light emitting layer EML3 may emit blue light in different wavelength ranges. To emit blue light in different wavelength ranges, the first light emitting layer EML1, the second light emitting layer EML2 and the third light emitting layer EML3 may include (e.g., be) the same material, and a method of adjusting a resonance distance may be utilized. In some embodiments, to emit blue light in different wavelength ranges, at least one selected from the first light emitting layer EML1, the second light emitting layer EML2 and the third light emitting layer EML3, and at least another one selected from the first light emitting layer EML1, the second light emitting layer EML2 and the third light emitting layer EML3 may include (e.g., be) different materials.

However, the present disclosure is not limited thereto. The first light emitting layer EML1, the second light emitting layer EML2 and the third light emitting layer EML3 may each emit blue light having a peak wavelength of (e.g., a peak wavelength in the range of) 440 nm to 480 nm and may be made of the same material.

In some embodiments, at least one selected from the first light emitting layer EML1, the second light emitting layer EML2 and the third light emitting layer EML3 may emit the first blue light having the first peak wavelength, another one selected from the first light emitting layer EML1, the second light emitting layer EML2 and the third light emitting layer EML3 may emit the second blue light having the second peak wavelength different from the first peak wavelength, and the remaining one selected from the first light emitting layer EML1, the second light emitting layer EML2 and the third light emitting layer EML3 may emit third blue light having a third peak wavelength different from the first peak wavelength and the second peak wavelength. In some embodiments, any one selected from the first peak wavelength, the second peak wavelength and the third peak wavelength may be in the range of 440 nm to less than 460 nm (e.g., equal to or greater than 440 nm and less than 460 nm). Another one selected from the first peak wavelength, the second peak wavelength and the third peak wavelength may be in the range of 460 nm to less than 470 nm (e.g., equal to or greater than 460 nm and less than 470 nm), and the remaining one selected from the first peak wavelength, the second peak wavelength and the third peak wavelength may be in the range of 470 nm to 480 nm.

According to some embodiments, the output light LE emitted from the light emitting layer OL is blue light and includes a long wavelength component, a medium wavelength component and a short wavelength component. Therefore, the light emitting layer OL may finally (e.g., the first through third light emitting layers EML1 through EML3 may collectively) emit blue light having a broader emission peak as the output light LE and improve color visibility at a side viewing angle.

According to the above-described embodiments, light efficiency can be increased, and the life of the display device can be extended as compared with a conventional light emitting element that does not employ a tandem structure, that is, a structure in which a plurality of light emitting layers are stacked.

In some embodiments, at least one selected from the first light emitting layer EML1, the second light emitting layer EML2 and the third light emitting layer EML3 may emit light of the third color, for example, blue light, and at least another one selected from the first light emitting layer EML1, the second light emitting layer EML2 and the third light emitting layer EML3 may emit light of the second color, for example, green light. In some embodiments, blue light emitted from at least one selected from the first light emitting layer EML1, the second light emitting layer EML2 and the third light emitting layer EML3 may have a peak wavelength in the range of 440 nm to 480 nm or 460 nm to 480 nm. Green light emitted from at least another one selected from the first light emitting layer EML1, the second light emitting layer EML2 and the third light emitting layer EML3 may have a peak wavelength in the range of 510 nm to 550 nm.

For example, any one selected from the first light emitting layer EML1, the second light emitting layer EML2 and the third light emitting layer EML3 may be a green light emitting layer that is to emit green light, and the other two selected from the first light emitting layer EML1, the second light emitting layer EML2 and the third light emitting layer EML3 may be blue light emitting layers that are to emit blue light. When the other two selected from the first light emitting layer EML1, the second light emitting layer EML2 and the third light emitting layer EML3 are blue light emitting layers, blue light emitted from the two blue light emitting layers may have the same peak wavelength range or different peak wavelength ranges.

According to some embodiments, the output light LE emitted from the light emitting layer OL may be a mixture of the first component LE1 which is blue light and the second component LE2 which is green light. For example, when the first component LE1 is deep blue light and the second component LE2 is green light, the output light LE may be light having a sky blue color. Similar to the above-described embodiments, the output light LE emitted from the light emitting layer OL may be a mixture of blue light and green light and includes a long wavelength component and a short wavelength component. Therefore, the light emitting layer OL may finally (e.g., the first through third light emitting layers EML1 through EML3 may collectively) emit blue light having a broader emission peak as the output light LE and improve color visibility at a side viewing angle. In addition, because the second component LE2 of the output light LE is green light, a green light component of light provided from the display device 1 to the outside can be supplemented. Accordingly, the color reproducibility of the display device 1 can be improved.

In some embodiments, a green light emitting layer among the first light emitting layer EML1, the second light emitting layer EML2, and the third light emitting layer EML3 may include (e.g., be) a host and a dopant. The host included in the green light emitting layer is not particularly limited as long as it is a commonly utilized or generally available material. For example, tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), and/or 2-methyl-9,10-bis(naphthalen-2-yl)anthracene (MADN) may be utilized.

The dopant included in the green light emitting layer may be, for example, a fluorescent material including (e.g., being) tris-(8-hydroyquinolato) aluminum(III) (Alq3) and/or a phosphorescent material such as fac tris(2-phenylpyridine)iridium (Ir(ppy)3), bis(2-phenylpyridine)(acetylacetonate)iridium(III) (Ir(ppy)2(acac)), and/or 2-phenyl-4-methyl-pyridine iridium (Ir(mpyp)3).

The first charge generation layer CGL1 may be located between the first stack ST1 and the second stack ST2. The first charge generation layer CGL1 may inject electric charges into each light emitting layer (e.g., the first light emitting layer EML1, the second light emitting layer EML2, the third light emitting layer EML3, and/or the fourth light emitting layer EML4, for example, the first light emitting layer EML1 and the second light emitting layer EML2). The first charge generation layer CGL1 may control the charge balance between the first stack ST1 and the second stack ST2. The first charge generation layer CGL1 may include an n-type charge generation layer CGL11 and a p-type charge generation layer CGL12. The p-type charge generation layer CGL12 may be disposed on the n-type charge generation layer CGL11 and may be located between the n-type charge generation layer CGL11 and the second stack ST2.

The first charge generation layer CGL1 may have a structure in which the n-type charge generation layer CGL11 and the p-type charge generation layer CGL12 are in contact (e.g., physical or direct contact) with each other. The n-type charge generation layer CGL11 is disposed closer to the first anode AE1 (AE2 of FIG. 7, AE3 of FIG. 7) among the first anode AE1 (AE2 of FIG. 7, AE3 of FIG. 7) and the cathode CE. The p-type charge generation layer CGL12 is disposed closer to the cathode CE among the first anode AE1 (AE2 of FIG. 7, AE3 of FIG. 7) and the cathode CE. In some embodiments, the n-type charge generation layer CGL11 may be closer to the first anode AE1 than the p-type charge generation layer CGL12 is to the first anode AE1, and the p-type charge generation layer CGL2 may be closer to the cathode CE than the n-type charge generation layer CGL11 is to the cathode CE. For example, the n-type charge generation layer CGL11 may be between the first anode AE1 and the p-type charge generation layer CGL12, and the p-type charge generation layer CGL12 may be between the n-type charge generation layer CGL11 and the cathode CE.

The n-type charge generation layer CGL11 supplies electrons to the first light emitting layer EML1 adjacent to the first anode AE1 (AE2 of FIG. 7, AE3 of FIG. 7), and the p-type charge generation layer CGL12 supplies holes to the second light emitting layer EML2 included in the second stack ST2. Because the first charge generation layer CGL1 is disposed between the first stack ST1 and the second stack ST2 to provide electric charges to each light emitting layer, luminous efficiency can be improved, and a driving voltage can be lowered.

The first stack ST1 may be located on the first anode AE1, the second anode AE2 (see FIG. 7) and the third anode AE3 (see FIG. 7) and may further include a first hole transport layer HTL1, a first electron blocking layer BIL1 and a first electron transport layer ETL1.

The first hole transport layer HTL1 may be located on the first anode AE1, the second anode AE2 (see FIG. 7), and the third anode AE3 (see FIG. 7). The first hole transport layer HTL1 may facilitate the transportation of holes and may include (e.g., be) a hole transport material. The hole transport material may include (e.g., be), but is not limited to, a carbazole derivative such as N-phenylcarbazole and/or polyvinylcarbazole; a fluorene derivative; a triphenylamine derivative such as N,N'-bis(3-methylphenyl)-N,N'-diphenyl-[1,1-biphenyl]-4,4'-diamine (TPD) and/or 4,4',4"-tris(N-carbazolyl)triphenylamine (TCTA); N,N'-di(1-naphthyl)-N, N'-diphenylbenzidine) (NPB); and/or 4,4'-Cyclohexylidene bis[N,N-bis(4-methylphenyl)benzenamine] (TAPC).

The first electron blocking layer BIL1 may be located on the first hole transport layer HTL1 and may be located between the first hole transport layer HTL1 and the first light emitting layer EML1. The first electron blocking layer BIL1 may include (e.g., be) a hole transport material and/or a metal or a metal compound in order to prevent or block electrons generated by the first light emitting layer EML1 from entering the first hole transport layer HTL1. In some embodiments, the first hole transport layer HTL1 and the first electron blocking layer BIL1 described above may be formed as a single layer in which their respective materials are mixed.

The first electron transport layer ETL1 may be located on the first light emitting layer EML1 and may be located between the first charge generation layer CGL1 and the first light emitting layer EML1. In some embodiments, the first electron transport layer ETL1 may include (e.g., be) an electron transport material such as tris-(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1, 3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) (Bebq2), 9,10-di(naphalene-2-yl)anthracene (ADN), or a mixture of the same. However, the present disclosure is not limited to the type (e.g., kind) of the electron transport material. The second stack ST2 may be located on the first charge generation layer CGL1 and may further include a second hole transport layer HTL2, a second electron blocking layer BIL2 and a second electron transport layer ETL2.

The second hole transport layer HTL2 may be located on the first charge generation layer CGL1. The second hole transport layer HTL2 may be made of the same material as the first hole transport layer HTL1 or may include (e.g., be) one or more materials selected from the example materials that may be included in the first hole transport layer HTL1. The second hole transport layer HTL2 may be composed of a single layer or a plurality of layers.

The second electron blocking layer BIL2 may be located on the second hole transport layer HTL2 and may be located between the second hole transport layer HTL2 and the second light emitting layer EML2. The second electron blocking layer BIL2 may have the same material and structure as the first electron blocking layer BIL1 or may include (e.g., be) one or more materials selected from the example materials that may be included in the first electron blocking layer BIL1.

The second electron transport layer ETL2 may be located on the second light emitting layer EML2 and may be located between the second charge generation layer CGL2 and the second light emitting layer EML2. The second electron transport layer ETL2 may include (e.g., be) the same material and structure as the first electron transport layer ETL1 or may include (e.g., be) one or more materials selected from the example materials that may be included in the first electron transport layer ETL1. The second electron transport layer ETL2 may be composed of a single layer or a plurality of layers.

The second charge generation layer CGL2 may be located on the second stack ST2 and may be located between the second stack ST2 and the third stack ST3.

The second charge generation layer CGL2 may have the same structure as the first charge generation layer CGL1 described above. For example, the second charge generation layer CGL2 may include an n-type charge generation layer CGL21 disposed closer to the second stack ST2 and a p-type charge generation layer CGL22 disposed closer to the cathode CE. The p-type charge generation layer CGL22 may be disposed on the n-type charge generation layer CGL21.

The second charge generation layer CGL2 may have a structure in which the n-type charge generation layer CGL21 and the p-type charge generation layer CGL22 are in contact (e.g., physical or direct contact) with each other. The first charge generation layer CGL1 and the second charge generation layer CGL2 may be made of different materials or the same material.

The third stack ST3 may be located on the second charge generation layer CGL2 and may further include a third hole transport layer HTL3 and a third electron transport layer ETL3.

The third hole transport layer HTL3 may be located on the second charge generation layer CGL2. The third hole transport layer HTL3 may be made of the same material as the first hole transport layer HTL1 or may include (e.g., be) one or more materials selected from the example materials that may be included in the first hole transport layer HTL1. The third hole transport layer HTL3 may be composed of a single layer or a plurality of layers. When the third hole transport layer HTL3 is composed of a plurality of layers, the layers may include (e.g., be) different materials.

The third electron transport layer ETL3 may be located on the third light emitting layer EML3 and may be located between the cathode CE and the third light emitting layer EML3. The third electron transport layer ETL3 may have the same material and structure as the first electron transport layer ETL1 or may include (e.g., be) one or more materials selected from the example materials that may be included in the first electron transport layer ETL1. The third electron transport layer ETL3 may be composed of a single layer or a plurality of layers. When the third electron transport layer ETL3 is composed of a plurality of layers, the layers may include (e.g., be) different materials.

A hole injection layer(s) may be further located between the first stack ST1 and the first anode AE1, between the second anode AE2 (see FIG. 7) and the third anode AE3 (see FIG. 7), between the second stack ST2 and the first charge generation layer CGL1, and/or between the third stack ST3 and the second charge generation layer CGL2. The hole injection layer(s) may facilitate the injection of holes into the first light emitting layer EML1, the second light emitting layer EML2 and the third light emitting layer EML3. In some embodiments, the hole injection layer(s) may be made of, but is not limited to, any one or more of copper phthalocyanine (CuPc), poly(3,4-ethylenedioxythiophene) (PEDOT), polyaniline (PANI), and N,N-dinaphthyl-N,N'-diphenyl benzidine (NPD). In some embodiments, the hole injection layer(s) may be located between the first stack ST1 and the first anode AE1, between the second anode AE2 (see FIG. 7) and the third anode AE3 (see FIG. 7), between the second stack ST2 and the first charge generation layer CGL1, and/or between the third stack ST3 and the second charge generation layer CGL2.

An electron injection layer(s) may be further located between the third electron transport layer ETL3 and the cathode CE, between the second charge generation layer CGL2 and the second stack ST2, and/or between the first charge generation layer CGL1 and the first stack ST1. The electron injection layer(s) may facilitate the injection of electrons and may utilize tris(8-hydroxyquinolino)aluminum) (Alq3), PBD, TAZ, spiro-PBD, Balq, and/or SAlq, but the present disclosure is not limited thereto. In addition, the electron injection layer(s) may be a metal halide compound and may be any one or more of, e.g., $MgF_2$, LiF, NaF (sodium fluoride), KF (potassium fluoride), RbF (rubidium fluoride), CsF (caesium fluoride), FrF (francium fluoride), LiI (lithium iodine), NaI, KI, RbI, CsI, FrI, and/or $CaF_2$, but the present disclosure is not limited thereto. In some embodiments, the electron injection layer(s) may include (e.g., be) a lanthanum material such as ytterbium (Yb), samarium (Sm), and/or europium (Eu). In some embodiments, the electron injection layer(s) may include (e.g., be) both a metal halide material and a lanthanum material such as RbI:Yb and/or KI:Yb. When the electron injection layer (s) includes (e.g., is) both a metal halide material and a lanthanum material, the electron injection layer may be formed by co-deposition of the metal halide material and the lanthanum material. In some embodiments, the electron injection layer(s) may be located between the third electron transport layer ETL3 and the cathode CE, between the second charge generation layer CGL2 and the second stack ST2 and/or between the first charge generation layer CGL1 and the first stack ST1.

The structure of the light emitting layer OL may also be modified from the above structure. For example, the light emitting layer OL may be modified to a light emitting layer OLa illustrated in FIG. 9. In some embodiments, the light emitting layer OLa illustrated in FIG. 9 may further include a fourth stack ST4 located between the third stack ST3 and the second stack ST2 and may further include a third charge generation layer CGL3 located between the third stack ST3 and the second stack ST2. For example, the third charge generation layer CGL3 may be between the third stack ST3 and the fourth stack ST4.

The fourth stack ST4 may include a fourth light emitting layer EML4 and may further include a fourth hole transport layer HTL4, a third electron blocking layer BIL4 and a fourth electron transport layer ETL4.

Each of the first light emitting layer EML1, the second light emitting layer EML2, the third light emitting layer EML3 and the fourth light emitting layer EML4 included in the light emitting layer OLa may emit light of the third color, for example, blue light. At least one selected from the first light emitting layer EML1, the second light emitting layer EML2, the third light emitting layer EML3 and the fourth light emitting layer EML4, and at least another one selected from the first light emitting layer EML1, the second light emitting layer EML2, the third light emitting layer EML3 and the fourth light emitting layer EML4 may emit blue light having different peak wavelength ranges.

In some embodiments, at least one selected from the first light emitting layer EML1, the second light emitting layer EML2, the third light emitting layer EML3 and the fourth light emitting layer EML4 may emit green light, and at least another one selected from the first light emitting layer EML1, the second light emitting layer EML2, the third light emitting layer EML3 and the fourth light emitting layer EML4 may emit blue light. For example, any one selected from the first light emitting layer EML1, the second light emitting layer EML2, the third light emitting layer EML3 and the fourth light emitting layer EML4 may be a green light emitting layer, and the other three light emitting layers may all be blue light emitting layers.

The fourth hole transport layer HTL4 may be located on the second charge generation layer CGL2. The fourth hole transport layer HTL4 may be made of the same material as the first hole transport layer HTL1 or may include (e.g., be) one or more materials selected from the example materials that may be included in the first hole transport layer HTL1. The fourth hole transport layer HTL4 may be composed of a single layer or a plurality of layers. When the fourth hole transport layer HTL4 is composed of a plurality of layers, the layers may include (e.g., be) different materials.

The third electron blocking layer BIL4 may be located on the fourth hole transport layer HTL4 and may be located between the fourth hole transport layer HTL4 and the fourth light emitting layer EML4. The third electron blocking layer BIL4 may include (e.g., be) the same material and structure as the first electron blocking layer BIL1 or may include (e.g., be) one or more materials selected from the example materials that may be included in the first electron blocking layer BIL1. In some embodiments, the third electron blocking layer BIL4 may be omitted.

The fourth electron transport layer ETL4 may be located on the fourth light emitting layer EML4 and may be located between the third charge generation layer CGL3 and the fourth light emitting layer EML4. The fourth electron transport layer ETL4 may have the same material and structure as the first electron transport layer ETL1 or may include (e.g., be) one or more materials selected from the example materials that may be included in the first electron transport layer ETL1. The fourth electron transport layer ETL4 may be composed of a single layer or a plurality of layers. When the fourth electron transport layer ETL4 is composed of a plurality of layers, the layers may include (e.g., be) different materials.

The third charge generation layer CGL3 may have the same structure as the first charge generation layer CGL1 described above. For example, the third charge generation layer CGL3 may include an n-type charge generation layer CGL31 disposed closer to the fourth stack ST4 and a p-type charge generation layer CGL32 disposed closer to the cathode CE. The p-type charge generation layer CGL32 may be disposed on the n-type charge generation layer CGL31.

The electron injection layer(s) may be further located between the fourth stack ST4 and the third charge generation layer CGL3. In addition, the hole injection layer(s) may be further located between the fourth stack ST4 and the second charge generation layer CGL2.

In some embodiments, both the light emitting layer OL illustrated in FIG. 8 and the light emitting layer OLa illustrated in FIG. 9 do not include a red light emitting layer and thus may not emit light of the first color, for example, red light. For example, in some embodiments, the output light LE does not include a light component whose peak wavelength is in the range of 610 nm to about 650 nm.

As illustrated in FIG. 7, the first capping layer 160 may be located on the cathode CE. The first capping layer 160 may be disposed in all of the first light emitting region LA1, the second light emitting region LA2, the third light emitting region LA3, and the non-light emitting region NLA. For example, the first capping layer 160 may be a common layer. The first capping layer 160 may improve viewing angle characteristics and increase external luminous efficiency.

In some embodiments, the first capping layer 160 may include (e.g., be) an organic material. For example, the first capping layer 160 may include (e.g., be) a triamine derivative, a carbazole biphenyl derivative, an arylenediamine derivative, and/or tris(8-hydroxyquinolino)aluminum (Alq3).

As illustrated in FIG. 7, the thin-film encapsulation layer 170 is disposed on the first capping layer 160. The thin-film encapsulation layer 170 is disposed in all of the first light emitting region LA1, the second light emitting region LA2, the third light emitting region LA3, and the non-light emitting region NLA. In some embodiments, the thin-film encapsulation layer 170 may directly cover the first capping layer 160. For example, the thin-film encapsulation layer 170 may be directly on the first capping layer 160.

In some embodiments, the thin-film encapsulation layer 170 may include the first lower inorganic layer 171, the first organic layer 173, and the first upper inorganic layer 175 sequentially stacked on the first capping layer 160.

The first lower inorganic layer 171 may cover the first light emitting element ED1, the second light emitting element ED2, and the third light emitting element ED3 in the display area DA.

The first lower inorganic layer 171 may include (e.g., be) an inorganic material and have a multilayer structure. In some embodiments, as illustrated in FIG. 10, the first lower inorganic layer 171 may include a first sub-inorganic layer 1711 and a second sub-inorganic layer 1713. In addition, the first lower inorganic layer 171 may further include a third sub-inorganic layer 1715.

The first sub-inorganic layer 1711 may be located on the first capping layer 160. The first sub-inorganic layer 1711 may prevent the first capping layer 160 from being damaged in the process of forming the second sub-inorganic layer 1713, or the first sub-inorganic layer 1711 may reduce such damage to the first capping layer 160. For example, the first sub-inorganic layer 1711 may function as a protective layer that protects the first capping layer 160. In some embodiments, the compressive stress of the first sub-inorganic layer 1711 may be 0 MPa to 200 MPa.

The second sub-inorganic layer 1713 may be located on the first sub-inorganic layer 1711. The second sub-inorganic layer 1713 may prevent or block moisture and/or oxygen from penetrating into the first light emitting element ED1, the second light emitting element ED2 and the third light emitting element ED3. For example, the second sub-inorganic layer 1713 may function as a barrier layer that prevents or blocks penetration of external moisture and/or oxygen. In some embodiments, the compressive stress of the second sub-inorganic layer 1713 may be 0 MPa to 200 MPa.

The third sub-inorganic layer 1715 may be located on the second sub-inorganic layer 1713. An upper surface of the third sub-inorganic layer 1715 may directly contact the first organic layer 173. In some embodiments, an uneven structure SR1 may be provided on the upper surface of the third sub-inorganic layer 1715 which directly contacts the first organic layer 173. Because the uneven structure SR1 is provided on the upper surface of the third sub-inorganic layer 1715, the upper surface of the third sub-inorganic layer 1715 may have a relatively greater surface roughness than an upper surface of the first sub-inorganic layer 1711 which contacts the second sub-inorganic layer 1713 or an upper surface of the second sub-inorganic layer 1713 which contacts the third sub-inorganic layer 1715.

In some embodiments, the uneven structure SR1 may be formed in any irregular pattern and/or irregular uneven shape. Because the uneven structure SR1 is provided on the upper surface of the third sub-inorganic layer 1715, the spreadability of an organic material in the process of forming the first organic layer 173 can be improved, and the organic material can spread on the third sub-inorganic layer 1715 relatively uniformly. In addition, because the uneven structure SR1 increases a contact area between the third sub-inorganic layer 1715 and the first organic layer 173, film detachment can be prevented or reduced, and the first organic layer 173 can be more firmly coupled (e.g., attached) to the first lower inorganic layer 171.

In some embodiments, the surface roughness of the uneven structure SR1 may be 5 nm to 100 nm based on root-mean-square roughness Rq. When the surface roughness Rq of the uneven structure SR1 is 5 nm to 100 nm, the adhesion between the first organic layer 173 and the first lower inorganic layer 171, and the spreadability of the organic material, can be improved.

In addition, when the output light LE emitted from the light emitting elements passes through the thin-film encapsulation layer 170, internal reflection may be reduced at the rough interface between the first organic layer 173 and the third sub-inorganic layer 1715, thereby improving light extraction efficiency. In addition, when external light is incident on the thin-film encapsulation layer 170, it may be refracted at the rough interface between the first organic layer 173 and the third sub-inorganic layer 1715, thereby suppressing reflection of the external light. The light extraction efficiency denotes an improvement in the luminance of the screen, and the suppression of external light reflection leads to an improvement in the contrast of the screen.

In some embodiments, due to the above-described uneven structure SR1, the upper surface of the third sub-inorganic layer 1715 may have a surface energy of 40 mN/m to 80 mN/m.

In some embodiments, a thickness Th13 of the second sub-inorganic layer 1713 may be greater than a thickness Th11 of the first sub-inorganic layer 1711 and greater than a thickness Th15 of the third sub-inorganic layer 1715.

In some embodiments, the thickness Th13 of the second sub-inorganic layer 1713 may be 10 Å to 50,000 Å. In addition, in some embodiments, the thickness Th11 of the first sub-inorganic layer 1711 may have a value in the range of 10 Å to 10,000 Å which is smaller than the thickness Th13 of the second sub-inorganic layer 1713. In addition, in some embodiments, the thickness Th15 of the third sub-inorganic layer 1715 may have a value in the range of 10 Å to 5,000 Å which is smaller than the thickness Th13 of the second sub-inorganic layer 1713 and enables implementation of the uneven structure SR1. Here, the thickness Th15 of the third sub-inorganic layer 1715 including the uneven structure SR1 may denote an average thickness.

In some embodiments, a refractive index n13 of the second sub-inorganic layer 1713 may be greater than a refractive index n11 of the first sub-inorganic layer 1711. In addition, in some embodiments, the refractive index n13 of the second sub-inorganic layer 1713 may be greater than a refractive index n15 of the third sub-inorganic layer 1715. From a material point of view of a film or layer, a refractive index is one of the physical elements that indicate the density of the material. In some embodiments, the refractive index n13 of the second sub-inorganic layer 1713 may be greater than the refractive index n11 of the first sub-inorganic layer 1711 and greater than the refractive index n15 of the third sub-inorganic layer 1715. Accordingly, the second sub-inorganic layer 1713 may function as a barrier layer.

In some embodiments, the refractive index n11 of the first sub-inorganic layer 1711, the refractive index n13 of the second sub-inorganic layer 1713, and the refractive index n15 of the third sub-inorganic layer 1715 may each be 1.7 or less.

As illustrated in FIG. 11, the extinction coefficient (k) increases as the refractive index increases and decreases as the refractive index decreases. In addition, when the refractive index is 1.7, the extinction coefficient converges to substantially zero as illustrated in the drawing for light having a wavelength of about 370 nm to about 800 nm. A reduction in extinction coefficient denotes a reduction in light loss due to light absorption, which, in turn, denotes an increase in light efficiency. When the refractive index n11 of the first sub-inorganic layer 1711, the refractive index n13 of the second sub-inorganic layer 1713, and the refractive index n15 of the third sub-inorganic layer 1715 are each 1.7 or less, light loss due to light absorption by the first lower inorganic layer 171 can be prevented or reduced. Consequently, the light efficiency can be increased.

In some embodiments, the refractive index n13 of the second sub-inorganic layer 1713 may be 1.5 to 1.7. In addition, in some embodiments, the refractive index n11 of the first sub-inorganic layer 1711 may be 1.3 to less than 1.7 (e.g., equal to or greater than 1.3 and less than 1.7) as long as it is smaller than the refractive index n13 of the second sub-inorganic layer 1713. In addition, in some embodiments, the refractive index n15 of the third sub-inorganic layer 1715 may be 1.3 to less than 1.7 (e.g., equal to or greater than 1.3 and less than 1.7) as long as it is smaller than the refractive index n13 of the second sub-inorganic layer 1713.

In some embodiments, each of the first sub-inorganic layer 1711, the second sub-inorganic layer 1713, and the third sub-inorganic layer 1715 may be made of an inorganic material and may be made of oxide and/or oxynitride. For example, the first sub-inorganic layer 1711, the second sub-inorganic layer 1713, and the third sub-inorganic layer 1715 may be made of silicon oxide, silicon oxynitride, aluminum oxide, aluminum oxynitride, tungsten oxide, tungsten oxynitride, titanium oxide, and/or titanium oxynitride.

In some embodiments, the first sub-inorganic layer 1711, the second sub-inorganic layer 1713, and the third sub-inorganic layer 1715 may all be made of an oxide of the same first material or an oxynitride of the same first material. The first material may be at least one selected from silicon (Si), aluminum (Al), tungsten (W), and titanium (Ti). For example, the first sub-inorganic layer 1711, the second sub-inorganic layer 1713, and the third sub-inorganic layer 1715 may all be made of silicon oxide $SiOx$ ($SiO_x$) or silicon oxynitride $SiOxNy$ ($SiO_xN_y$).

In some embodiments, the second sub-inorganic layer 1713 may be made of an oxynitride of the first material, and the first sub-inorganic layer 1711 and the third sub-inorganic layer 1715 may be made of an oxide of the first material or an oxynitride of the first material. In addition, a content (e.g., concentration, at. %, etc.) of oxygen atoms in the second sub-inorganic layer 1713 may be smaller than a content of oxygen atoms in the first sub-inorganic layer 1711 and smaller than a content of oxygen atoms in the third sub-inorganic layer 1715. In addition, a content of nitrogen atoms in the second sub-inorganic layer 1713 may be greater than a content of nitrogen atoms in the first sub-inorganic layer 1711 and greater than a content of nitrogen atoms in the third sub-inorganic layer 1715.

In the case of an oxide of the same material or an oxynitride of the same material, the refractive index tends to decrease as the oxygen atom content increases, and refractive index and barrier properties tend to increase as the oxygen atom content decreases and/or as the nitrogen atom content increases. Therefore, the second sub-inorganic layer 1713 having better barrier properties than each of the first sub-inorganic layer 1711 and the third sub-inorganic layer 1715 may have a relatively low oxygen atom content and a relatively high nitrogen atom content.

In some embodiments, the first sub-inorganic layer 1711 and the third sub-inorganic layer 1715 may be made of silicon oxide, and the second sub-inorganic layer 1713 may be made of silicon oxynitride.

In some embodiments, the first sub-inorganic layer 1711 and the second sub-inorganic layer 1713 may be made of silicon oxynitride, and the third sub-inorganic layer 1715 may be made of silicon oxide. In addition, the second sub-inorganic layer 1713 may have a relatively lower oxygen atom content than the first sub-inorganic layer 1711 and may have a relatively higher nitrogen atom content than the first sub-inorganic layer 1711.

In some embodiments, the first sub-inorganic layer 1711, the second sub-inorganic layer 1713, and the third sub-inorganic layer 1715 may all be made of silicon oxynitride. In addition, the second sub-inorganic layer 1713 may have a relatively lower oxygen atom content than each of the first sub-inorganic layer 1711 and the third sub-inorganic layer 1715 and may have a relatively higher nitrogen atom content than the first sub-inorganic layer 1711 and the third sub-inorganic layer 1715.

As illustrated in FIGS. 7 and 10, the first organic layer 173 may be located on the first lower inorganic layer 171. The first organic layer 173 may cover the first light emitting element ED1, the second light emitting element ED2, and the third light emitting element ED3 in the display area DA.

In some embodiments, the first organic layer 173 may be made of acrylic resin, methacrylic resin, polyisoprene, vinyl resin, epoxy resin, urethane resin, cellulose resin, and/or perylene resin.

In some embodiments, a thickness Th3 of the first organic layer 173 may be about 2 μm to 8 μm.

The first upper inorganic layer 175 may be located on the first organic layer 173. The first upper inorganic layer 175 may cover the first organic layer 173. In some embodiments, the first upper inorganic layer 175 may directly contact the first lower inorganic layer 171 in the non-display area NDA to form an inorganic-inorganic bond.

In some embodiments, the first upper inorganic layer 175 may be made of an inorganic material and may be made of oxide and/or oxynitride. For example, the first upper inorganic layer 175 may be made of silicon oxide, silicon oxynitride, aluminum oxide, aluminum oxynitride, tungsten oxide, tungsten oxynitride, titanium oxide, and/or titanium oxynitride.

In some embodiments, a refractive index of the first upper inorganic layer 175 may be 1.7 or less.

Because the inorganic layers included in the thin-film encapsulation layer 170 have a refractive index of 1.7 or less, the extinction coefficient may converge to substantially zero. Therefore, light loss in the inorganic layers included in the thin-film encapsulation layer 170 can be prevented or reduced, and the light efficiency can be improved.

The structure of the thin-film encapsulation layer 170 can be variously and suitably modified from the above-described structure.

Figure 12:
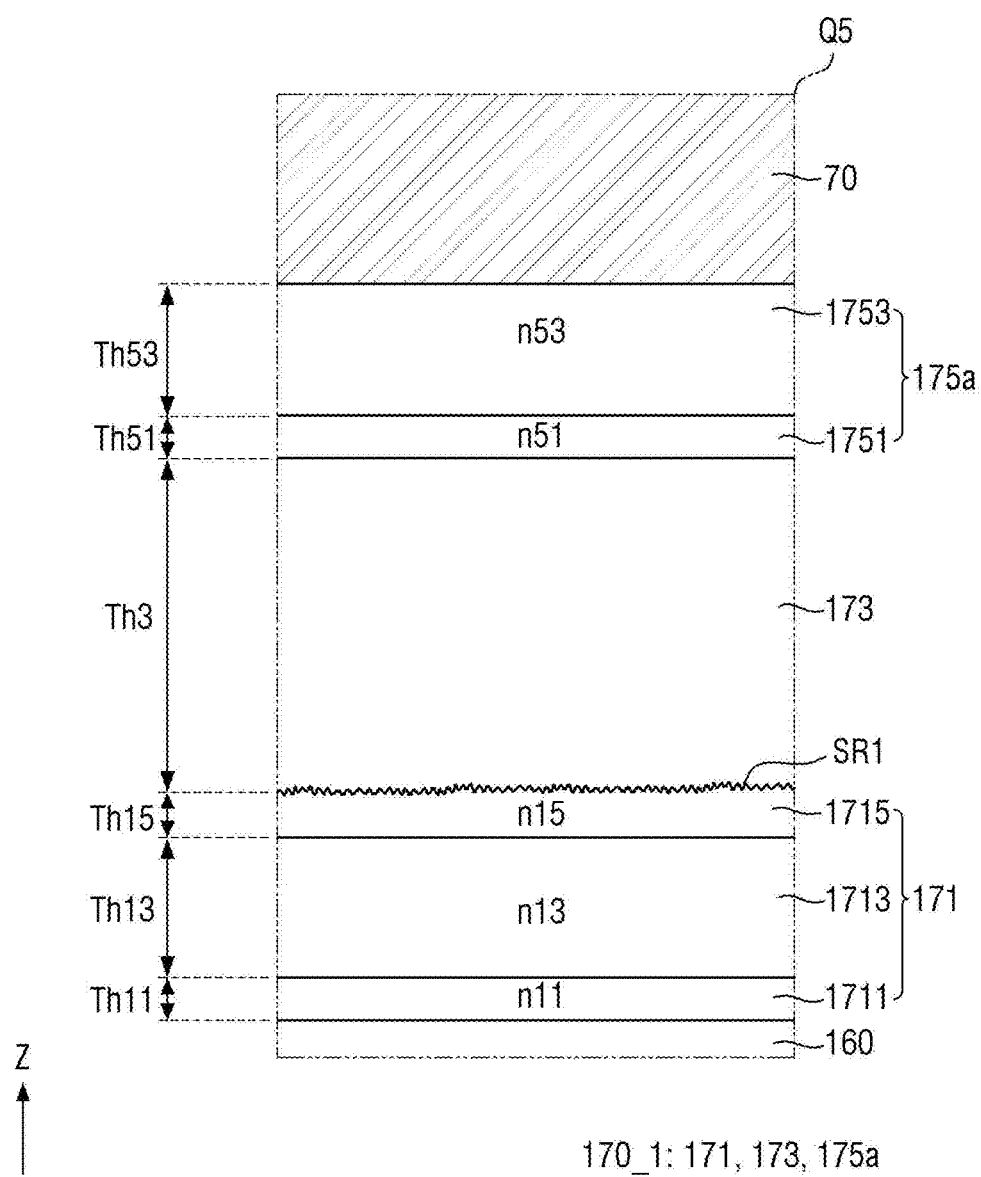
FIG. 12 is a cross-sectional view of a modified example of FIG. 10.
Figure 13:
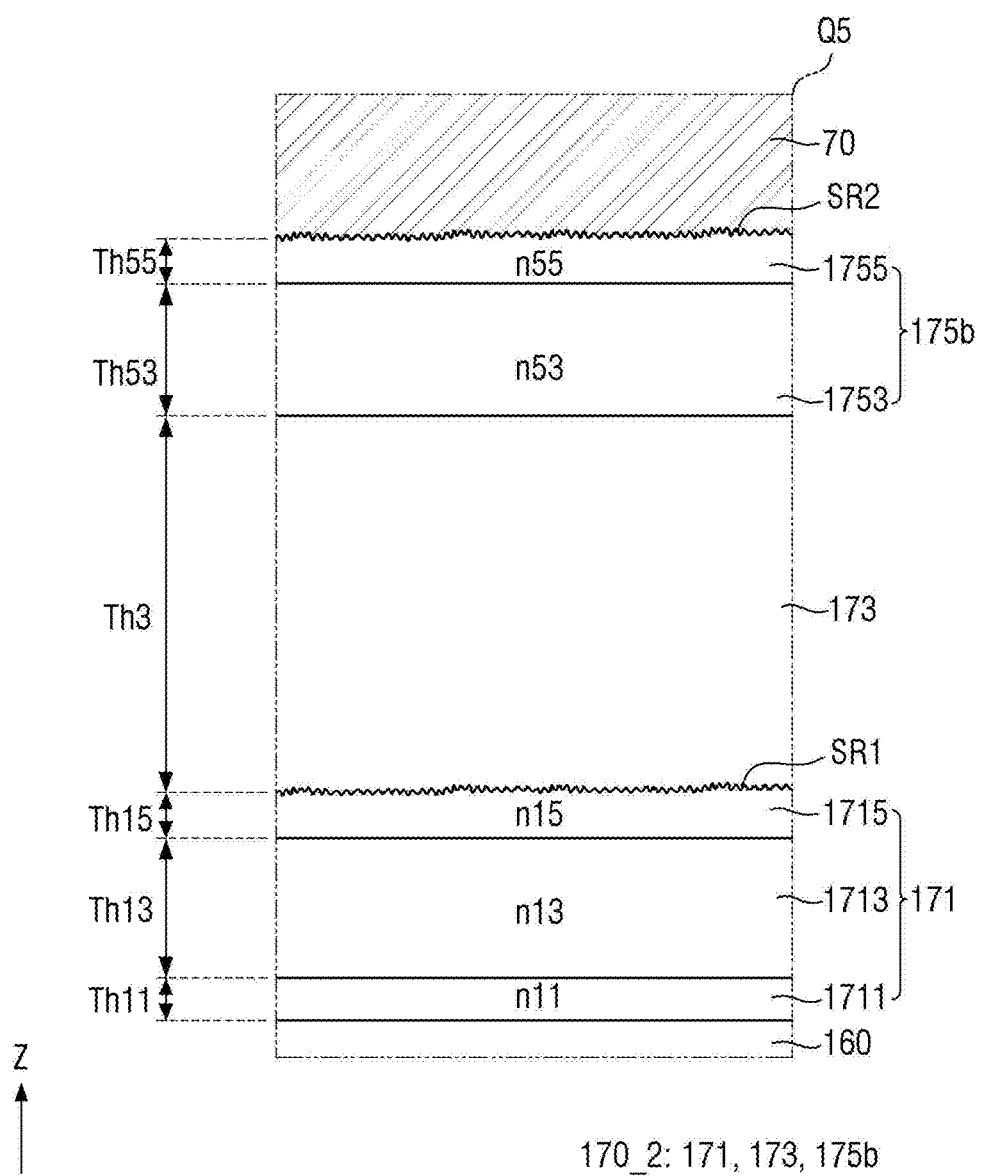
FIG. 13 is a cross-sectional view of a modified example of FIG. 10.
Figure 14:
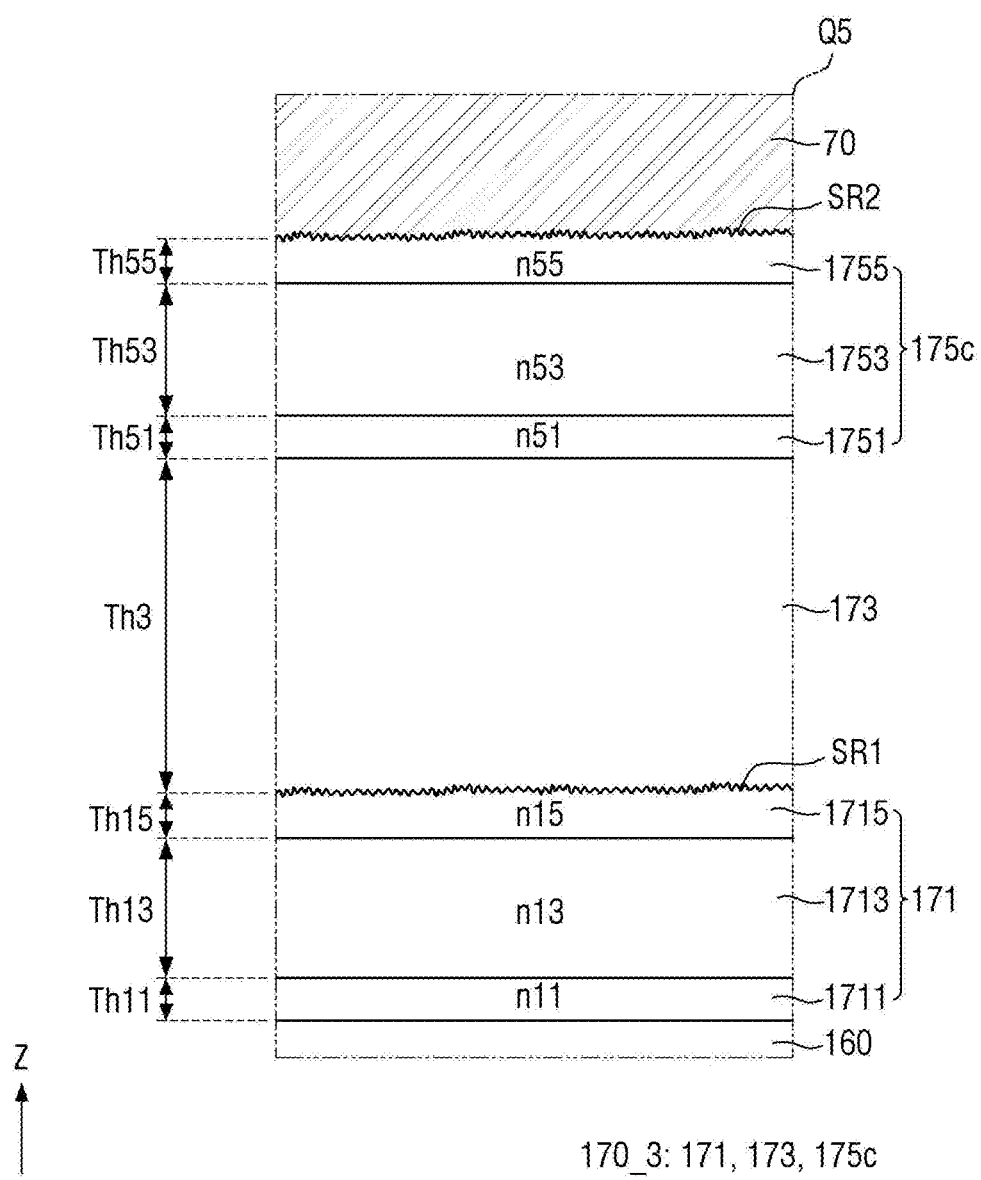
FIG. 14 is a cross-sectional view of a modified example of FIG. 10.

FIG. 12 is a cross-sectional view of a modified example of FIG. 10. FIG. 13 is a cross-sectional view of a modified example of FIG. 10. FIG. 14 is a cross-sectional view of a modified example of FIG. 10.

Referring to FIG. 12, the thin-film encapsulation layer 170 (see FIG. 10) may be modified to a thin-film encapsulation layer 170_1 illustrated in FIG. 12. The thin-film encapsulation layer 170_1 may include a first lower inorganic layer 171, a first organic layer 173, and a first upper inorganic layer 175a.

The first upper inorganic layer 175a of the thin-film encapsulation layer 170_1 may include a fourth sub-inorganic layer 1751 and a fifth sub-inorganic layer 1753.

The fourth sub-inorganic layer 1751 may be located on the first organic layer 173 and may block or reduce outgas generated in the first organic layer 173.

The fifth sub-inorganic layer 1753 may be located on the fourth sub-inorganic layer 1751 and may function as a barrier layer that prevents or blocks penetration of external moisture and/or oxygen.

In some embodiments, a thickness Th53 of the fifth sub-inorganic layer 1753 may be greater than a thickness Th51 of the fourth sub-inorganic layer 1751.

In some embodiments, the thickness Th53 of the fifth sub-inorganic layer 1753 may be 10 Å to 50,000 Å. In addition, in some embodiments, the thickness Th51 of the fourth sub-inorganic layer 1751 may be 10 Å to 10,000 Å as long as it is smaller than the thickness Th53 of the fifth sub-inorganic layer 1753.

In some embodiments, a refractive index n53 of the fifth sub-inorganic layer 1753 may be greater than a refractive index n51 of the fourth sub-inorganic layer 1751.

In some embodiments, the refractive index n53 of the fifth sub-inorganic layer 1753 and the refractive index n51 of the fourth sub-inorganic layer 1751 may each be 1.7 or less. In some embodiments, the refractive index n53 of the fifth sub-inorganic layer 1753 may be 1.5 to 1.7, and the refractive index n51 of the fourth sub-inorganic layer 1751 may be 1.3 to less than 1.7 (e.g., equal to or greater than 1.3 and less than 1.7) as long as it is smaller than the refractive index n53 of the fifth sub-inorganic layer 1753.

In some embodiments, each of the fourth sub-inorganic layer 1751 and the fifth sub-inorganic layer 1753 may be made of an inorganic material and may be made of oxide and/or oxynitride. For example, the fourth sub-inorganic layer 1751 and the fifth sub-inorganic layer 1753 may be made of silicon oxide, silicon oxynitride, aluminum oxide, aluminum oxynitride, tungsten oxide, tungsten oxynitride, titanium oxide, and/or titanium oxynitride.

In some embodiments, the fourth sub-inorganic layer 1751 and the fifth sub-inorganic layer 1753 may all be made of an oxide of the same second material or an oxynitride of the same second material. The second material may include (e.g., be) silicon (Si), aluminum (Al), tungsten (W), and/or titanium (Ti). For example, the fourth sub-inorganic layer 1751 and the fifth sub-inorganic layer 1753 may all be made of silicon oxide or silicon oxynitride.

In some embodiments, the fifth sub-inorganic layer 1753 may be made of an oxynitride of the second material, and the fourth sub-inorganic layer 1751 may be made of an oxide of the second material or an oxynitride of the second material. In addition, a content of oxygen atoms in the fifth sub-inorganic layer 1753 may be smaller than a content of oxygen atoms in the fourth sub-inorganic layer 1751. In addition, a content of nitrogen atoms in the fifth sub-inorganic layer 1753 may be greater than a content of nitrogen atoms in the fourth sub-inorganic layer 1751. In addition, in some embodiments, the content of nitrogen atoms in the fifth sub-inorganic layer 1753 may be greater than the content of nitrogen atoms in a third sub-inorganic layer 1715.

In some embodiments, the fourth sub-inorganic layer 1751 may be made of silicon oxide, and the fifth sub-inorganic layer 1753 may be made of silicon oxynitride.

In some embodiments, the fourth sub-inorganic layer 1751 and the fifth sub-inorganic layer 1753 may each be made of silicon oxynitride, and the fifth sub-inorganic layer 1753 may have a relatively lower oxygen atom content than the fourth sub-inorganic layer 1751 and may have a relatively higher nitrogen atom content than the fourth sub-inorganic layer 1751.

Referring to FIG. 13, the thin-film encapsulation layer 170 (see FIG. 10) may be modified to a thin-film encapsulation layer 170_2 illustrated in FIG. 13. The thin-film encapsulation layer 170_2 may include a first lower inorganic layer 171, a first organic layer 173, and a first upper inorganic layer 175b.

The first upper inorganic layer 175b may include a fifth sub-inorganic layer 1753 and a sixth sub-inorganic layer 1755.

The fifth sub-inorganic layer 1753 is the same or similar to that described above with reference to FIG. 12, and thus a detailed description thereof may not be provided.

The sixth sub-inorganic layer 1755 may be located on the fifth sub-inorganic layer 1753.

An upper surface of the sixth sub-inorganic layer 1755 may directly contact a filler 70. In some embodiments, an uneven structure SR2 may be provided on the upper surface of the sixth sub-inorganic layer 1755 which directly contacts the filler 70. Because the uneven structure SR2 is provided on the upper surface of the sixth sub-inorganic layer 1755, the upper surface of the sixth sub-inorganic layer 1755 may have a relatively greater surface roughness than an upper surface of the fifth sub-inorganic layer 1753 which contacts the sixth sub-inorganic layer 1755.

In some embodiments, the uneven structure SR2 may be formed in any irregular pattern and/or irregular uneven shape. Because the uneven structure SR2 is provided on the upper surface of the sixth sub-inorganic layer 1755, the spreadability of an organic material that forms the filler 70 in the process of forming the filler 70 can be improved, and the organic material can spread on the sixth sub-inorganic layer 1755 relatively uniformly. In addition, because the uneven structure SR2 increases a contact area between the sixth sub-inorganic layer 1755 and the filler 70, the filler 70 and the sixth sub-inorganic layer 1755 can be more firmly coupled (e.g., attached) to each other.

In some embodiments, the surface roughness of the uneven structure SR2 provided on the upper surface of the sixth sub-inorganic layer 1755 may be 5 nm to 100 nm based on root-mean-square roughness Rq. When the surface roughness Rq of the uneven structure SR2 is 5 nm to 100 nm, the adhesion between the filler 70 and the sixth sub-inorganic layer 1755, and the spreadability of the organic material, can be improved.

In addition, the uneven structure SR2 can improve the light extraction efficiency by reducing internal reflection of light and suppressing reflection of external light by refracting the external light. The light extraction efficiency denotes an improvement in the luminance of the screen, and the suppression of external light reflection leads to an improvement in the contrast of the screen.

In some embodiments, due to the above-described uneven structure SR2, the upper surface of the sixth sub-inorganic layer 1755 may have a surface energy of 40 mN/m to 80 mN/m.

In some embodiments, a thickness Th55 of the sixth sub-inorganic layer 1755 may be smaller than a thickness Th53 of the fifth sub-inorganic layer 1753. For example, the thickness Th55 of the sixth sub-inorganic layer 1755 may be 10 Å to 5,000 Å as long as it is smaller than the thickness Th53 of the fifth sub-inorganic layer 1753.

In some embodiments, a refractive index n55 of the sixth sub-inorganic layer 1755 may be 1.7 or less and may be smaller than a refractive index n53 of the fifth sub-inorganic layer 1753. For example, the refractive index n55 of the sixth sub-inorganic layer 1755 may be 1.3 to less than 1.7 (e.g., equal to or greater than 1.3 and less than 1.7) as long as it is smaller than the refractive index n53 of the fifth sub-inorganic layer 1753.

The sixth sub-inorganic layer 1755 may be made of an inorganic material and may be made of oxide and/or oxynitride. For example, the sixth sub-inorganic layer 1755 may include (e.g., be) any one or more of the example materials that may be included in the fourth sub-inorganic layer 1751 (see FIG. 12) and/or the fifth sub-inorganic layer 1753, as described with respect to FIG. 12.

In some embodiments, when the fifth sub-inorganic layer 1753 is made of an oxynitride of the second material, the sixth sub-inorganic layer 1755 may be made of an oxide of the second material or an oxynitride of the second material. When the sixth sub-inorganic layer 1755 is made of an oxynitride of the second material, it may have a relatively higher oxygen atom content than the fifth sub-inorganic layer 1753 and may have a relatively lower nitrogen atom content than the fifth sub-inorganic layer 1753. For example, both the sixth sub-inorganic layer 1755 and the fifth sub-inorganic layer 1753 may be made of silicon oxynitride, and the sixth sub-inorganic layer 1755 may include relatively more oxygen atoms (e.g., relatively more oxygen atoms per total number of atoms) than the fifth sub-inorganic layer 1753 while including relatively fewer nitrogen atoms (e.g., relatively fewer nitrogen atoms per total number of atoms) than the fifth sub-inorganic layer 1753.

Referring to FIG. 14, the thin-film encapsulation layer 170 (see FIG. 10) may be modified to a thin-film encapsulation layer 170_3 illustrated in FIG. 14. The thin-film encapsulation layer 170_3 may include a first lower inorganic layer 171, a first organic layer 173, and a first upper inorganic layer 175c.

The first upper inorganic layer 175c may further include a fourth sub-inorganic layer 1751 located between the first organic layer 173 and a fifth sub-inorganic layer 1753 as illustrated in FIG. 14. The fourth sub-inorganic layer 1751, the fifth sub-inorganic layer 1753, and a sixth sub-inorganic layer 1755 are respectively the same or similar to those described above, and thus a more detailed description thereof may not be provided.

The color conversion substrate 30 will now be described with reference to FIGS. 15 through 19 in addition to FIG. 7.

Figure 15:
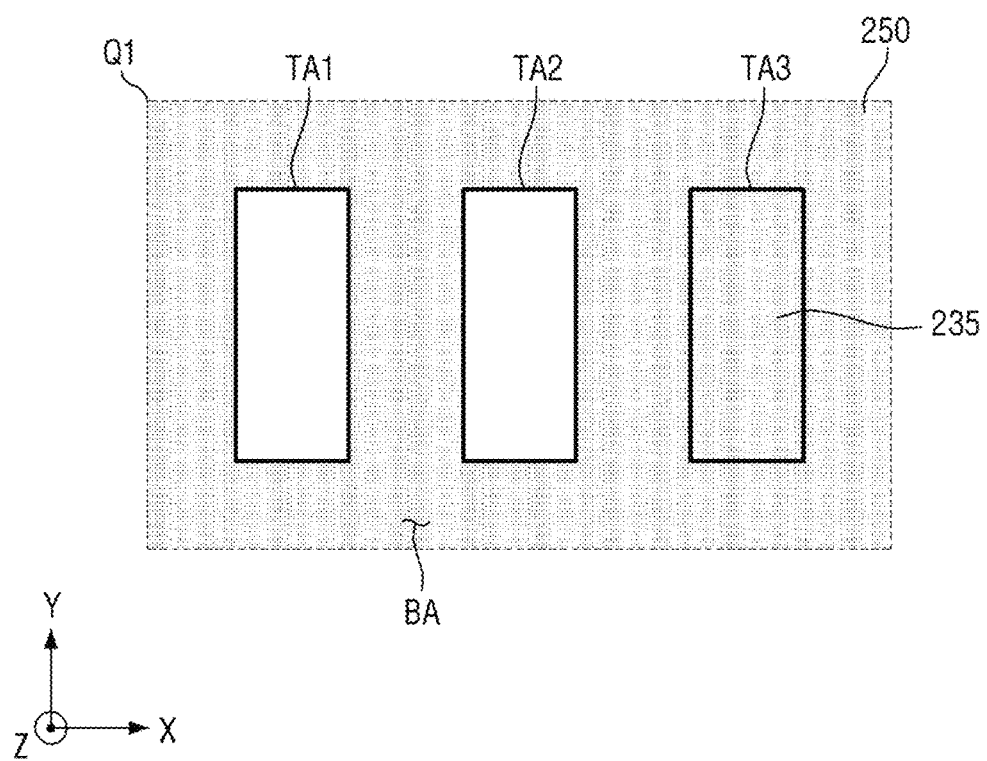
FIG. 15 is a plan view illustrating the schematic arrangement of a third color filter and a color pattern in the color conversion substrate of the display device according to the embodiment.
Figure 16:
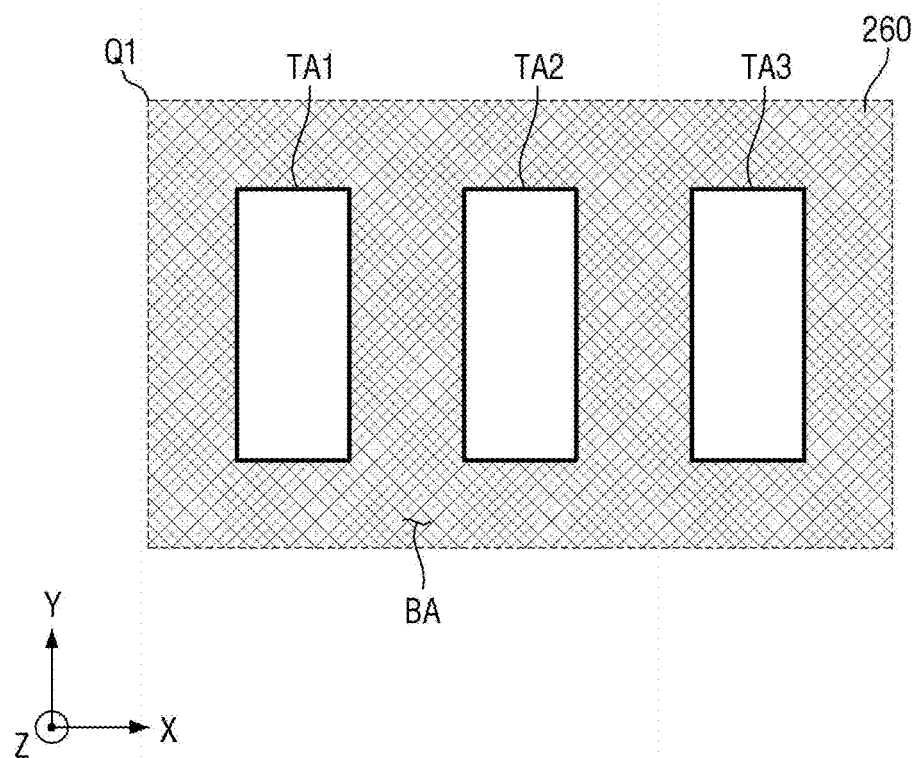
FIG. 16 is a plan view illustrating the schematic arrangement of a light blocking pattern in the color conversion substrate of the display device according to the embodiment.
Figure 17:
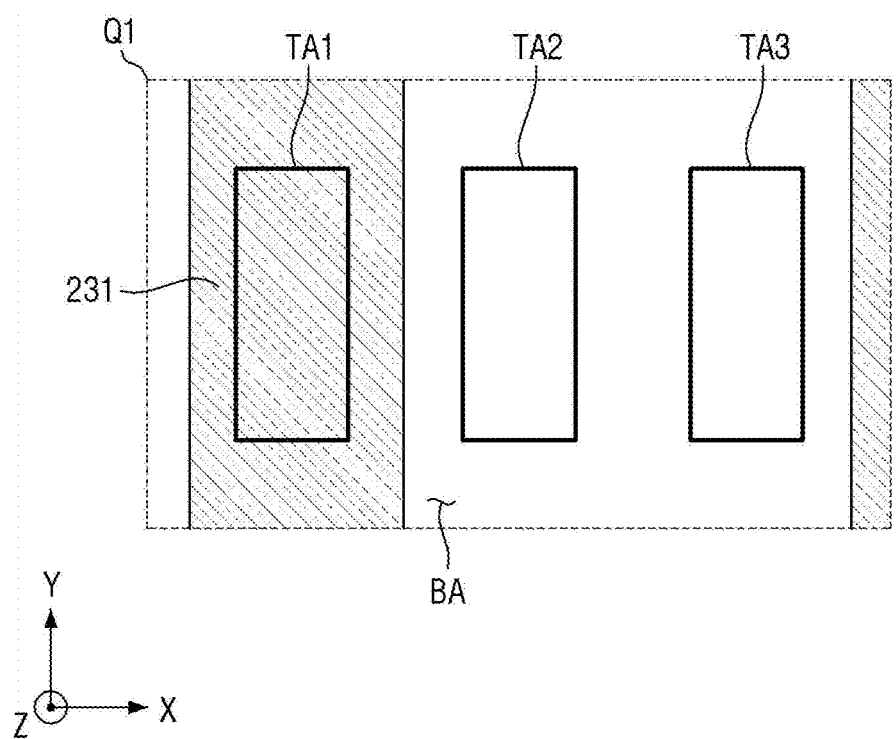
FIG. 17 is a plan view illustrating the schematic arrangement of a first color filter in the color conversion substrate of the display device according to the embodiment.
Figure 18:
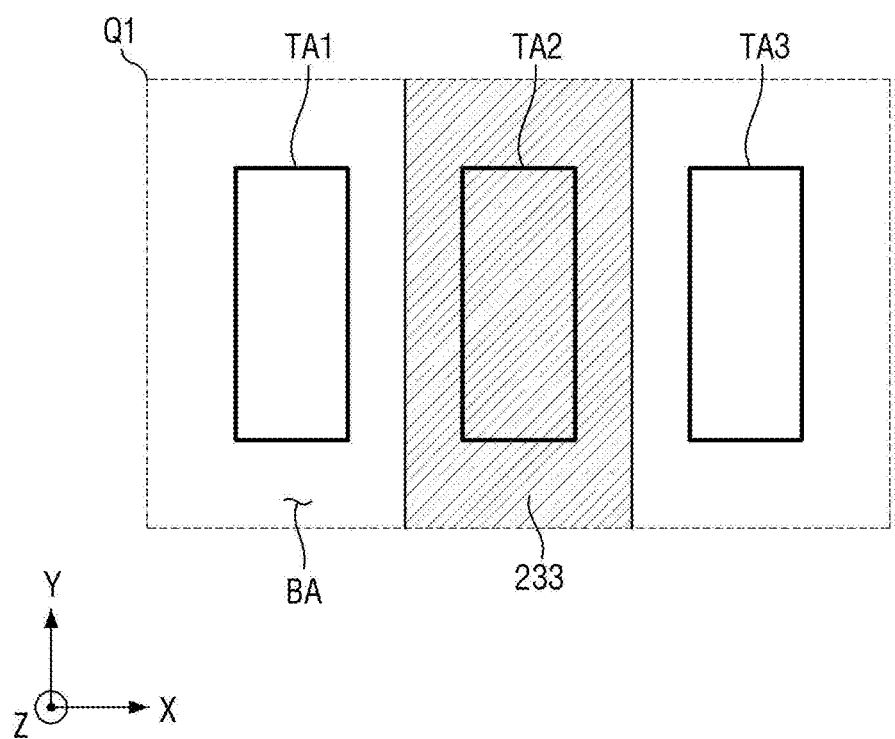
FIG. 18 is a plan view illustrating the schematic arrangement of a second color filter in the color conversion substrate of the display device according to the embodiment.
Figure 19:
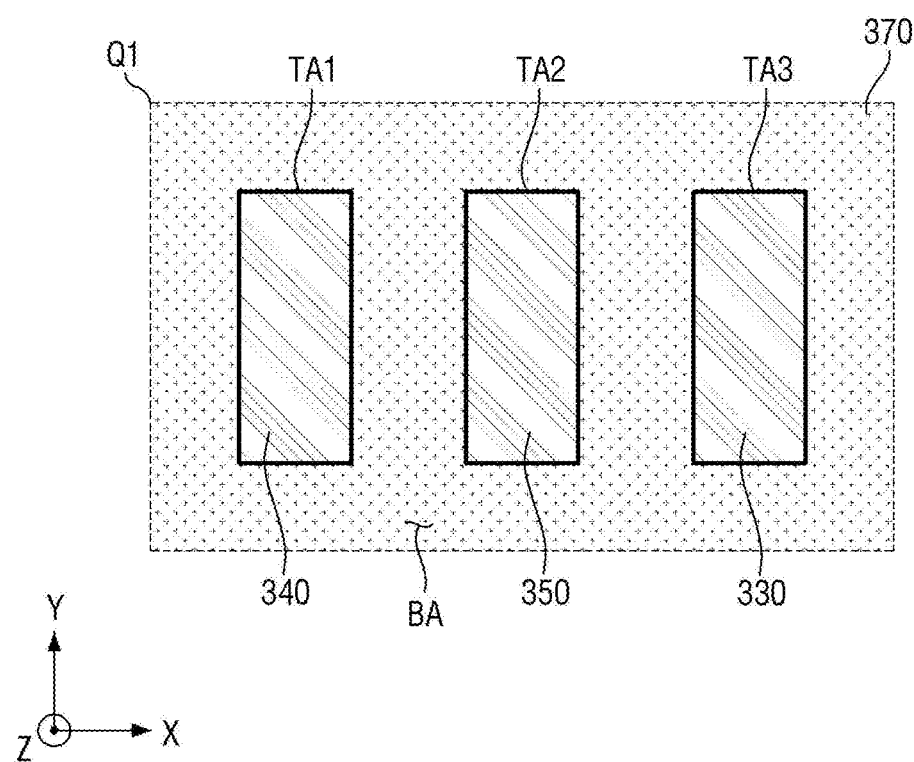
FIG. 19 is a plan view illustrating the schematic arrangement of a bank pattern, a first wavelength conversion pattern, a second wavelength conversion pattern, and a light transmission pattern in the color conversion substrate of the display device according to the embodiment.

FIG. 15 is a plan view illustrating the schematic arrangement of a third color filter 235 and the color pattern 250 in the color conversion substrate 30 of the display device 1 according to the embodiment. FIG. 16 is a plan view illustrating the schematic arrangement of a light blocking pattern 260 in the color conversion substrate 30 of the display device 1 according to the embodiment. FIG. 17 is a plan view illustrating the schematic arrangement of the first color filter 231 in the color conversion substrate 30 of the display device 1 according to the embodiment. FIG. 18 is a plan view illustrating the schematic arrangement of the second color filter 233 in the color conversion substrate 30 of the display device 1 according to the embodiment. FIG. 19 is a plan view illustrating the schematic arrangement of the bank pattern 370, a first wavelength conversion pattern 340, a second wavelength conversion pattern 350, and a light transmission pattern 330 in the color conversion substrate 30 of the display device 1 according to the embodiment.

Referring to FIGS. 7 and 15 through 19, a second base 310 illustrated in FIG. 7 may be made of a light transmitting material.

In some embodiments, the second base 310 may include a glass substrate and/or a plastic substrate. In some embodiments, the second base 310 may further include a separate layer located on the glass substrate or the plastic substrate, for example, an insulating layer such as an inorganic layer.

In some embodiments, the light transmitting regions TA1 through TA3 and the light blocking region BA may be defined in the second base 310 as described above.

As illustrated in FIG. 7, the third color filter 235 and the color pattern 250 may be located on a surface (e.g., a bottom surface) of the second base 310 which faces the display substrate 10.

The third color filter 235 may overlap the third light emitting region LA3 and/or the third light transmitting region TA3.

The third color filter 235 may transmit only light of the third color (e.g., blue light) and block and/or absorb light of the first color (e.g., red light) and light of the second color (e.g., green light). In some embodiments, the third color filter 235 may be a blue color filter and may include (e.g., be) a blue colorant such as a blue dye and/or a blue pigment. As used herein, the term 'colorant' is a concept encompassing both a dye and/or a pigment.

The color pattern 250 may overlap the non-light emitting region NLA and/or the light blocking region BA.

The color pattern 250 may absorb a portion of light introduced from the outside of the display device 1 into the display device 1, thereby reducing reflected light due to external light. A considerable portion of external light is reflected, causing distortion of the color gamut of the display device 1. However, when the color pattern 250 is located in the non-light emitting region NLA and the non-display area NDA according to the current embodiment, color distortion due to reflection of external light can be reduced.

In some embodiments, the color pattern 250 may include (e.g., be) a blue colorant such as a blue dye and/or a blue pigment. In some embodiments, the color pattern 250 may be made of the same material as the third color filter 235 and may be formed at the same time as the third color filter 235.

When the color pattern 250 includes (e.g., is) a blue colorant, external light or reflected light transmitted through the color pattern 250 may be blue light. The color sensibility of a user's eyes varies according to the color of light. For example, light of a blue wavelength band may be perceived less sensitively by the user than light of a green wavelength band and light of a red wavelength band. Therefore, because the color pattern 250 includes (e.g., is) a blue colorant, the user may perceive reflected light relatively less sensitively.

In some embodiments, as illustrated in FIG. 15, the color pattern 250 may be disposed over the entire light blocking region BA. In addition, in some embodiments, the color pattern 250 and the third color filter 235 may be coupled (e.g., connected) to each other as illustrated in FIG. 15.

As illustrated in FIGS. 7 and 16, the light blocking pattern 260 may be located on the surface (e.g., bottom surface) of the second base 310 which faces the display substrate 10. The light blocking pattern 260 may overlap the light blocking region BA to block transmission of light. In some embodiments, the light blocking pattern 260 may be disposed in a substantially lattice shape in the plan view as illustrated in FIG. 16.

In some embodiments, the light blocking pattern 260 may include (e.g., be) an organic light blocking material and may be formed by coating and exposing the organic light blocking material.

As described above, external light may cause distortion of the color gamut of the display device 1. However, when the light blocking pattern 260 is located on the second base 310 according to the current embodiment, at least a portion of the external light is absorbed by the light blocking pattern 260. Therefore, color distortion due to reflection of the external light can be reduced. In some embodiments, the light blocking pattern 260 may prevent or reduce color mixing due to intrusion of light between adjacent light transmitting regions, thereby further improving the color gamut.

In some embodiments, the light blocking pattern 260 may be located on the color pattern 250. For example, the light blocking pattern 260 may be located opposite the second base 310 with the color pattern 250 interposed between them. For example, the light blocking pattern 260 may be on a lower surface of the color pattern 250.

Because the color pattern 250 is located between the light blocking pattern 260 and the second base 310, the light blocking pattern 260 may not contact the second base 310 in some embodiments.

The first color filter 231 and the second color filter 233 may be located on the surface (e.g., bottom surface) of the second base 310 which faces the display substrate 10.

The first color filter 231 may overlap the first light emitting region LA1 and/or the first light transmitting region TA1, and the second color filter 233 may overlap the second light emitting region LA2 and/or the second light transmitting region TA2.

In some embodiments, the first color filter 231 may block and/or absorb light of the third color (e.g., blue light). For example, the first color filter 231 may function as a blue light blocking filter that blocks blue light. In some embodiments, the first color filter 231 may transmit only light of the first color (e.g., red light) and block and/or absorb light of the third color (e.g., blue light) and light of the second color (e.g., green light). For example, the first color filter 231 may be a red color filter and may include (e.g., be) a red colorant.

The second color filter 233 may block and/or absorb light of the third color (e.g., blue light). For example, the second color filter 233 may also function as a blue light blocking filter. In some embodiments, the second color filter 233 may transmit only light of the second color (e.g., green light) and block and/or absorb light of the third color (e.g., blue light) and light of the first color (e.g., red light). For example, the second color filter 233 may be a green color filter and may include (e.g., be) a green colorant.

In some embodiments, a portion of the first color filter 231 may be further located in the light blocking region BA as illustrated in FIGS. 7 and 17, and a portion of the second color filter 233 may be further located in the light blocking region BA as illustrated in FIGS. 7 and 18. For example, each of the first color filter 231 and the second color filter 233 may cover a part (e.g., an edge) of a bottom surface of the light blocking pattern 260.

In some embodiments, a portion of the first color filter 231 may be further located in the blocking region BA between the first light transmitting region TA1 and the second light transmitting region TA2 and between the first light transmitting region TA1 and the third light transmitting region TA3.

In some embodiments, a portion of the second color filter 233 may be further located in the light blocking region BA between the first light transmitting region TA1 and the second light transmitting region TA2 and between the second light transmitting region TA2 and the third light transmitting region TA3.

Although the first color filter 231 and the second color filter 233 do not overlap each other in the drawings, in some embodiments, they may overlap each other in the light blocking region BA between the first light transmitting region TA1 and the second light transmitting region TA2. A portion of the light blocking region BA in which the first color filter 231 and the second color filter 233 overlap may function as a light blocking member that blocks transmission of light.

In some embodiments, the first color filter 231 and the second color filter 233 may be located over the entire light blocking region BA and may overlap each other in the entire light blocking region BA.

In some embodiments, the first color filter 231 and the second color filter 233 may overlap the color pattern 250 in the light blocking region BA. For example, the color pattern 250 may overlap the first color filter 231 and the second color filter 233 in the light blocking region BA between the first light transmitting region TA1 and the second light transmitting region TA2. In addition, the color pattern 250 may overlap the second color filter 233 in the light blocking region BA between the second light transmitting region TA2 and the third light transmitting region TA3. In addition, the color pattern 250 may overlap the first color filter 231 in the light blocking region BA between the third light transmitting region TA3 and the first light transmitting region TA1.

In the light blocking region BA, a portion where the first color filter 231 and the color pattern 250 overlap and a portion where the second color filter 233 and the color pattern 250 overlap may function as light blocking members. In the light blocking region BA, the portion where the first color filter 231 and the color pattern 250 overlap and the portion where the second color filter 233 and the color pattern 250 overlap may absorb at least a portion of external light, thereby reducing color distortion due to reflection of the external light. In addition, light emitted to the outside may be prevented or blocked from intruding between adjacent light emitting regions and thus causing color mixing. Accordingly, the color gamut of the display device 1 can be improved.

As illustrated in FIG. 7, a second capping layer 391 may be located on the surface (e.g., bottom surface) of the second base 310 to cover the light blocking pattern 260, the color pattern 250, the first color filter 231, the second color filter 233, and the third color filter 235. In some embodiments, the second capping layer 391 may directly contact the first color filter 231, the second color filter 233, and the third color filter 235. In addition, in some embodiments, the second capping layer 391 may directly contact the light blocking pattern 260.

The second capping layer 391 may prevent or block impurities such as moisture and/or air from being introduced from the outside (e.g., from portions of the display device under the second capping layer 391) and damaging and/or contaminating the light blocking pattern 260, the color pattern 250, the first color filter 231, the second color filter 233, and the third color filter 235. In addition, the second capping layer 391 may prevent or block the colorants contained in the first color filter 231, the second color filter 233 and the third color filter 235 from being diffused to other elements (e.g., elements of the display device under the second capping layer 391) such as the first wavelength conversion pattern 340 and the second wavelength conversion pattern 350. In some embodiments, the second capping layer 391 may be made of an inorganic material. For example, the second capping layer 391 may include (e.g., be) silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride.

The bank pattern 370 may be located on a surface (e.g., bottom surface) of the second capping layer 391 which faces the display substrate 10. In some embodiments, the bank pattern 370 may be located directly on the surface of the second capping layer 391 and may directly contact the second capping layer 391.

In some embodiments, the bank pattern 370 may overlap the non-light emitting region NLA and/or the light blocking region BA. In some embodiments, the bank pattern 370 may be around (e.g., surround) the first light transmitting region TA1, the second light transmitting region TA2, and/or the third light transmitting region TA3 in the plan view, for example, as illustrated in FIG. 19. The bank pattern 370 may separate spaces in which the first wavelength conversion pattern 340, the second wavelength conversion pattern 350, and/or the light transmission pattern 330 are disposed.

In some embodiments, the bank pattern 370 may be formed as one integrally coupled (e.g., connected) pattern, as illustrated in FIG. 19, but the present disclosure is not limited thereto. In an embodiment, a portion of the bank pattern 370 which is around (e.g., surrounds) the first light transmitting region TA1, a portion of the bank pattern 370 which is around (e.g., surrounds) the second light transmitting region TA2, and a portion of the bank pattern 370 which is around (e.g., surrounds) the third light transmitting region TA3 may be formed as individual patterns separated from (e.g., spaced apart from and/or not integrally coupled (e.g., connected) with) each other.

When the first wavelength conversion pattern 340, the second wavelength conversion pattern 350, and the light transmission pattern 330 are formed by a method of ejecting an ink composition utilizing a nozzle, for example, an inkjet printing method, the bank pattern 370 may serve as a guide that stably positions the ejected ink composition at a set or desired position. For example, the bank pattern 370 may function as a barrier wall.

In some embodiments, the bank pattern 370 may overlap the pixel defining layer 150.

In some embodiments, the bank pattern 370 may include (e.g., be) an organic material having photocurability. In addition, in some embodiments, the bank pattern 370 may include (e.g., be) an organic material having photocurability and including (e.g., being) a light blocking material. When the bank pattern 370 has light blocking properties, it can prevent or block light from intruding between neighboring (e.g., adjacent) light emitting regions in the display area DA. For example, the bank pattern 370 may block the output light LE emitted from the second light emitting element ED2 from entering the first wavelength conversion pattern 340 overlapping the first light emitting region LA1. In addition, the bank pattern 370 may block or prevent external light (e.g., light from outside the display device) from entering elements located under the bank pattern 370 in the non-light emitting region NLA.

The first wavelength conversion pattern 340, the second wavelength conversion pattern 350, and the light transmission pattern 330 may be located on (e.g., on the bottom surface of) the second capping layer 391. In some embodiments, the first wavelength conversion pattern 340, the second wavelength conversion pattern 350, and the light transmission pattern 330 may be located in the display area DA.

The light transmission pattern 330 may overlap the third light emitting region LA3 and/or the third light emitting element ED3. The light transmission pattern 330 may be located in a space defined by the bank pattern 370 in the third light transmitting region TA3. For example, the light transmission pattern 330 may be located in an opening of the bank pattern 370 that overlaps the third light transmitting region TA3.

In some embodiments, the light transmission pattern 330 may be formed as an island-shaped pattern as illustrated in FIG. 19. For example, in the plan view, the light transmission pattern 330 may be entirely surrounded by the bank pattern 370. Although the light transmission pattern 330 does not overlap the light blocking region BA in the drawings, this is merely an example. In some embodiments, a portion of the light transmission pattern 330 may overlap the light blocking region BA.

The light transmission pattern 330 may transmit incident light. The output light LE provided by the third light emitting element ED3 may be blue light as described above. The output light LE which is blue light is transmitted through the light transmission pattern 330 and the third color filter 235 and then emitted to the outside of the display device 1. For example, third light L3 emitted out of the display device 1 through the third light emitting region LA3 may be blue light.

In some embodiments, the light transmission pattern 330 may include a first base resin 331 and may further include a first scatterer 333 dispersed in the first base resin 331.

The first base resin 331 may be made of a material having high light transmittance. In some embodiments, the first base resin 331 may be made of an organic material. For example, the first base resin 331 may include (e.g., be) an organic material such as epoxy resin, acrylic resin, cardo resin, and/or imide resin.

The first scatterer 333 may have a refractive index different from that of the first base resin 331 and may form an optical interface with the first base resin 331. For example, the first scatterer 333 may be light scattering particles. The first scatterer 333 is not particularly limited as long as it is a material that can scatter at least a portion of transmitted light (e.g., at least a portion of the output light LE that enters the light transmission pattern 330). For example, the first scatterer 333 may be metal oxide particles and/or organic particles. The metal oxide may be, for example, titanium oxide ($TiO_2$), zirconium oxide ($ZrO_2$), aluminum oxide ($Al_2O_3$), indium oxide ($In_2O_3$), zinc oxide (ZnO), and/or tin oxide ($SnO_2$). The material of the organic particles may be, for example, acrylic resin and/or urethane resin. The first scatterer 333 may scatter incident light in random or various directions regardless of the incident direction of the incident light without substantially changing the wavelength of the light transmitted through the light transmission pattern 330.

In some embodiments, the light transmission pattern 330 may directly contact the second capping layer 391 and/or the bank pattern 370.

The first wavelength conversion pattern 340 may be located on the second capping layer 391 (e.g., on the bottom surface of the second capping layer 391) and may overlap the first light emitting region LA1, the first light emitting element ED1 and/or the first light transmitting region TA1.

In some embodiments, the first wavelength conversion pattern 340 may be located in a space defined by the bank pattern 370 in the first light transmitting region TA1. For example, the first wavelength conversion pattern 340 may be in an opening of the bank pattern 370.

In some embodiments, the first wavelength conversion pattern 340 may be formed as an island-shaped pattern as illustrated in FIG. 19. For example, in the plan view, the first wavelength conversion pattern 340 may be entirely surrounded by the bank pattern 370. Although the first wavelength conversion pattern 340 does not overlap the light blocking region BA in the drawings, this is merely an example. In some embodiments, a portion of the first wavelength conversion pattern 340 may overlap the light blocking region BA.

In some embodiments, the first wavelength conversion pattern 340 may directly contact the second capping layer 391 and/or the bank pattern 370.

The first wavelength conversion pattern 340 may convert or shift a peak wavelength of incident light into another set peak wavelength and output light having the set peak wavelength. In some embodiments, the first wavelength conversion pattern 340 may convert the output light LE provided by the first light emitting element ED1 into red light having a peak wavelength in the range of 610 nm to 650 nm and output the red light.

In some embodiments, the first wavelength conversion pattern 340 may include a second base resin 341 and a first wavelength shifter 345 dispersed in the second base resin 341 and may further include a second scatterer 343 dispersed in the second base resin 341.

The second base resin 341 may be made of a material having high light transmittance. In some embodiments, the second base resin 341 may be made of an organic material. In some embodiments, the second base resin 341 may be made of the same material as the first base resin 331 or may include (e.g., be) at least one selected from the example materials that may be included in the first base resin 331.

The first wavelength shifter 345 may convert or shift a peak wavelength of incident light (e.g., of the output light LE that enters the first wavelength conversion pattern 340) to another set peak wavelength. In some embodiments, the first wavelength shifter 345 may convert the output light LE of the third color, which is blue light provided by the first light emitting element ED1, into red light having a set (e.g., single) peak wavelength in the range of 610 nm to 650 nm and output the red light.

Examples of the first wavelength shifter 345 may include quantum dots, quantum rods, and/or phosphors. For example, the quantum dots may be particulate materials that emit light of a set color when electrons transit from a conduction band to a valence band.

The quantum dots may be semiconductor nanocrystalline materials. The quantum dots may have a set band gap according to their composition and size. Thus, the quantum dots may absorb light and then emit light having a set (e.g., unique) wavelength. Examples of semiconductor nanocrystals of the quantum dots include group IV nanocrystals, group II-VI compound nanocrystals, group III-V compound nanocrystals, group IV-VI nanocrystals, and combinations of the same.

The group II-VI compounds may be selected from binary compounds (selected from CdSe, CdTe, ZnS, ZnSe, ZnTe, ZnO, HgS, HgSe, HgTe, MgSe, MgS and mixtures of the same); ternary compounds (selected from InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures of the same); and quaternary compounds (selected from HgZnTeS, CdZnSeS, CdZnSeTe, CdZnSTe, CdHgSeS, CdHgSeTe, CdHgSTe, HgZnSeS, HgZnSeTe, HgZnSTe and mixtures of the same).

The group III-V compounds may be selected from binary compounds (selected from GaN, GaP, GaAs, GaSb, AlN, AlP, AlAs, AlSb, InN, InP, InAs, InSb and mixtures of the same); ternary compounds (selected from GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb and mixtures of the same); and quaternary compounds (selected from GaAlNAs, GaAlNP, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures of the same).

The group IV-VI compounds may be selected from binary compounds (selected from SnS, SnSe, SnTe, PbS, PbSe, PbTe and mixtures of the same); ternary compounds (selected from SnSeS, SnSeTe, SnSTe, PbSeS, PbSeTe, PbSTe, SnPbS, SnPbSe, SnPbTe and mixtures of the same); and quaternary compounds (selected from SnPbSSe, SnPbSeTe, SnPbSTe and mixtures of the same). The group IV elements may be selected from silicon (Si), germanium (Ge), and a mixture of the same. The group IV compounds may be binary compounds selected from silicon carbide (SiC), silicon germanium (SiGe), and a mixture of the same.

Here, the binary, ternary and/or quaternary compounds may be present in the particles at a uniform concentration or may be present in the particles at partially different concentrations. For example, the concentration of the binary, ternary, and/or quaternary compounds in a particle may not be uniform. In addition, they may have a core/shell structure in which one quantum dot is around (e.g., surrounds) another quantum dot. An interface between the core and the shell may have a concentration gradient in which the concentration of an element present in the shell is reduced toward the center (e.g., center of the shell and/or core).

In some embodiments, the quantum dots may have a core-shell structure including a core containing the above-described nanocrystal and a shell around (e.g., surrounding) the core. The shell of each quantum dot may serve as a protective layer for maintaining semiconductor characteristics by preventing or reducing chemical denaturation of the core and/or may serve as a charging layer for giving electrophoretic characteristics to the quantum dot. The shell may be a single layer or a multilayer. An interface between the core and the shell may have a concentration gradient in which the concentration of an element present in the shell is reduced toward the center (e.g., center of the shell and/or the core). The shell of each quantum dot may be, for example, a metal or non-metal oxide, a semiconductor compound, or a combination of the same.

For example, the metal or non-metal oxide may be, but is not limited to, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO or a combination of the same, and/or a ternary compound such as $MgAl_2O_4$, $CoFe_2O_4$, $NiFe_2O_4$, $CoMn_2O_4$ or a combination of the same.

In addition, the semiconductor compound may be, but is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination of the same.

Light emitted from the first wavelength shifter 345 may have a full width of half maximum (FWHM) of an emission wavelength spectrum of about 45 nm or less, about 40 nm or less, or about 30 nm or less. Therefore, the color purity and color reproducibility of the display device 1 can be further improved. In addition, the light emitted from the first wavelength shifter 345 may be radiated in various directions regardless of the incident direction of incident light. Therefore, the lateral visibility (e.g., viewing angle) of the first color displayed in the first light transmitting region TA1 can be improved (e.g., increased).

A portion of the output light LE provided by the first light emitting element ED1 may be transmitted through the first wavelength conversion pattern 340 without being converted into red light by the first wavelength shifter 345. Of the output light LE, a component incident on the first color filter 231 without being converted by the first wavelength conversion pattern 340 may be blocked by the first color filter 231. On the other hand, red light into which the output light LE has been converted by the first wavelength conversion pattern 340 may be transmitted through the first color filter 231 and emitted to the outside. For example, first light L1 emitted out of the display device 1 through the first light transmitting region TA1 may be red light.

The second scatterer 343 may have a refractive index different from that of the second base resin 341 and may form an optical interface with the second base resin 341. For example, the second scatterer 343 may be light scattering particles. Other details of the second scatterer 343 are substantially the same or similar to those of the first scatterer 333, and thus a description thereof may not be provided.

The second wavelength conversion pattern 350 may be located in a space defined by the bank pattern 370 in the second light transmitting region TA2. For example, the second wavelength conversion pattern 350 may be in an opening of the bank pattern 370.

In some embodiments, the second wavelength conversion pattern 350 may be formed as an island-shaped pattern as illustrated in FIG. 19. For example, in the plan view, the second wavelength conversion pattern 350 may be entirely surrounded by the bank pattern 370. In some embodiments, a portion of the second wavelength conversion pattern 350 may overlap the light blocking region BA.

In some embodiments, the second wavelength conversion pattern 350 may directly contact the second capping layer 391 and/or the bank pattern 370.

The second wavelength conversion pattern 350 may convert or shift a peak wavelength of incident light (e.g., the output light LE that enters the second wavelength conversion pattern 350) into another set peak wavelength and output light having the set peak wavelength. In some embodiments, the second wavelength conversion pattern 350 may convert the output light LE provided by the second light emitting element ED2 into green light in the range of about 510 nm to about 550 nm and output the green light.

In some embodiments, the second wavelength conversion pattern 350 may include a third base resin 351 and a second wavelength shifter 355 dispersed in the third base resin 351 and may further include a third scatterer 353 dispersed in the third base resin 351.

The third base resin 351 may be made of a material having high light transmittance. In some embodiments, the third base resin 351 may be made of an organic material. In some embodiments, the third base resin 351 may be made of the same material as the first base resin 331 or may include (e.g., be) at least one selected from the example materials that may be included in the first base resin 331.

The second wavelength shifter 355 may convert or shift a peak wavelength of incident light (e.g., the output light LE that enters the second wavelength conversion pattern 350) to another set peak wavelength. In some embodiments, the second wavelength shifter 355 may convert blue light having a peak wavelength in the range of 440 nm to 480 nm into green light having a peak wavelength in the range of 510 nm to 550 nm.

Examples of the second wavelength shifter 355 may include quantum dots, quantum rods, and/or phosphors. The second wavelength shifter 355 may be substantially the same or similar to the first wavelength shifter 345 described above, and thus a more detailed description thereof may not be provided.

In some embodiments, both the first wavelength shifter 345 and the second wavelength shifter 355 may be composed of quantum dots. In this case, the particle size of quantum dots constituting the second wavelength shifter 355 may be smaller than that of quantum dots constituting the first wavelength shifter 345.

The third scatterer 353 may have a refractive index different from that of the third base resin 351 and may form an optical interface with the third base resin 351. For example, the third scatterer 353 may be light scattering particles. Other details of the third scatterer 353 are substantially the same or similar to those of the second scatterer 343, and thus a description thereof may not be provided.

The output light LE emitted from the second light emitting element ED2 may be provided to the second wavelength conversion pattern 350, and the second wavelength shifter 355 may convert the output light LE provided by the second light emitting element ED2 into green light having a peak wavelength in the range of about 510 nm to about 550 nm and emit the green light.

A portion of the output light LE which is blue light may be transmitted through the second wavelength conversion pattern 350 without being converted into green light by the second wavelength shifter 355 and may be blocked by the second color filter 233. On the other hand, green light into which the output light LE has been converted by the second wavelength conversion pattern 350 may be transmitted through the second color filter 233 and emitted to the outside. Accordingly, second light L2 emitted out of the display device 1 through the second light transmitting region TA2 may be green light.

A third capping layer 393 may be located on (e.g., on the bottom surface of) the bank pattern 370, the light transmission pattern 330, the first wavelength conversion pattern 340, and the second wavelength conversion pattern 350. The third capping layer 393 may cover (e.g., cover the bottom surface of) the light transmission pattern 330, the first wavelength conversion pattern 340, and the second wavelength conversion pattern 350. In some embodiments, the third capping layer 393 may also be located in the non-display area NDA (see FIG. 1). In the non-display area NDA (see FIG. 1), the third capping layer 393 may directly contact the second capping layer 391 and seal the light transmission pattern 330, the first wavelength conversion pattern 340 and the second wavelength conversion pattern 350. Accordingly, it is possible to prevent or block impurities such as moisture and/or air from being introduced from the outside and damaging or contaminating the light transmission pattern 330, the first wavelength conversion pattern 340 and the second wavelength conversion pattern 350.

In some embodiments, the third capping layer 393 may be made of an inorganic material. In some embodiments, the third capping layer 393 may be made of the same material as the second capping layer 391 or may include (e.g., be) at least one selected from the example materials mentioned in the description of the second capping layer 391.

The filler 70 may be located in the space between the color conversion substrate 30 and the display substrate 10 as described above. In some embodiments, the filler 70 may directly contact the third capping layer 393 and the thin-film encapsulation layer 170 as illustrated in FIG. 7.

FIG. 20 is a view for explaining the reliability of the display device 1 according to one or more embodiments, more specifically, is an image obtained as a result of testing the reliability of each display device under an environment of a temperature of 85° C. and a humidity of 85% by modifying the structure of a thin-film encapsulation layer.

A first example EX1 in FIG. 20 is a case where the thin-film encapsulation layer is composed of two lower inorganic layers, an organic layer, and an upper inorganic layer having a single layer structure. For example, it is a structure obtained by omitting the first sub-inorganic layer 1711 (see FIG. 10) from the structure of FIG. 10. An inorganic layer corresponding to the second sub-inorganic layer 1713 (see FIG. 10) was made of silicon oxynitride SiOxNy ($SiO_xN_y$) and formed to have a refractive index of 1.62 and a thickness of 0.8 μm, and an inorganic layer corresponding to the first upper inorganic layer 175 (see FIG. 10) was made of silicon oxynitride SiOxNy ($SiO_xN_y$) and formed to have a refractive index of 1.64 and a thickness of 0.7 μm.

In the first example EX1, after 750 hours under the environment of the temperature of 85° C. and the humidity of 85%, about 45% of display devices experienced deterioration of display quality in a portion A1 of an edge due to penetration of moisture and oxygen. After 1,000 hours, the display devices according to the first example EX1 had defects 100% (e.g., 100% of the display devices had defects) due to the penetration of external moisture and oxygen.

A second example EX2 in FIG. 20 is a case where the thin-film encapsulation layer further includes an inorganic layer corresponding to the first sub-inorganic layer 1711 (see FIG. 10) compared with the first example EX1. The second example EX2 is the same as the first example EX1 except for an element corresponding to the first sub-inorganic layer 1711 (see FIG. 10). The inorganic layer corresponding to the first sub-inorganic layer 1711 (see FIG. 10) was made of silicon oxynitride SiOxNy ($SiO_xN_y$) and formed to have a refractive index of 1.62 and a thickness of 500 Å.

In the second example EX2, even after 750 hours, display devices did not have defects. After 1,000 hours, about 5% of the display devices had a slight color change at a corner A2.

A third example EX3 in FIG. 20 is a case where the thin-film encapsulation layer further includes an inorganic layer corresponding to the fourth sub-inorganic layer 1751 (see FIG. 12) compared with the second example EX2. The third example EX3 is the same as the second example EX2 except for an element corresponding to the fourth sub-inorganic layer 1751 (see FIG. 12). The inorganic layer corresponding to the fourth sub-inorganic layer 1751 (see FIG. 12) was made of silicon oxynitride SiOxNy ($SiO_xN_y$) and formed to have a refractive index of 1.62 and a thickness of 500 Å.

In the third example EX3, even after 750 hours, display devices did not have defects. After 1,000 hours, about 5% of the display devices had some defects in a display area, but there was no trace of moisture or oxygen penetration at edges of the display devices.

According to the above-described embodiments, even if the extinction coefficient is made to converge to substantially zero by reducing the refractive indices of the inorganic layers included in the thin-film encapsulation layer, because an inorganic layer is additionally disposed under an inorganic layer functioning as a barrier, the storage reliability of the thin-film encapsulation layer can be maintained at an excellent level (e.g., can be improved).

Therefore, according to the one or more embodiments of the present disclosure, the light efficiency of the display device 1 can be improved while the reliability of the display device 1 is maintained. Furthermore, when an uneven structure is provided on an inorganic layer of the thin-film encapsulation layer, the spreadability of an organic material is improved, and the adhesion between the two layers is improved. Therefore, the reliability of the display device 1 can be further improved.

Figure 21:
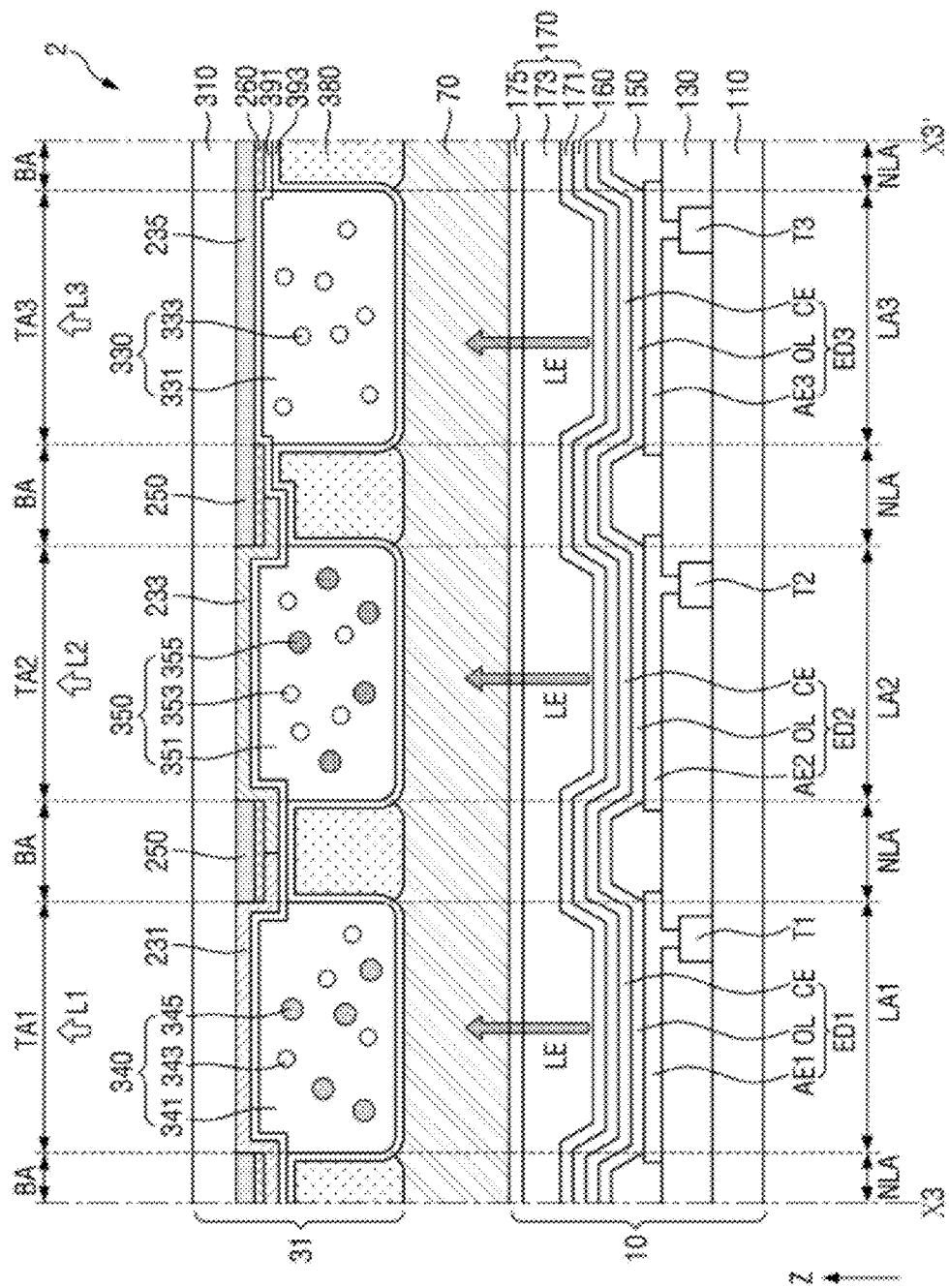
FIG. 21 is a cross-sectional view of a display device according to an embodiment, taken along line X3-X3' of FIGS. 3 and 4.

FIG. 21 is a cross-sectional view of a display device 2 according to an embodiment, taken along line X3-X3' of FIGS. 3 and 4.

Referring to FIG. 21, the display device 2 according to the current embodiment includes a display substrate 10, a color conversion substrate 31, and a filler 70. The display device 2 is substantially the same or similar to the embodiment of FIG. 7 except for the configuration of the color conversion substrate 31, for example, except that the color conversion substrate 31 includes a color mixing preventing member 380 and does not include a bank pattern 370 (see FIG. 7). Therefore, a redundant description may not be provided, and differences will be mainly described.

A first wavelength conversion pattern 340, a second wavelength conversion pattern 350, and a light transmission pattern 330 may be located on a second capping layer 391. In some embodiments, each of the first wavelength conversion pattern 340, the second wavelength conversion pattern 350, and the light transmission pattern 330 may be formed by coating a photosensitive material and exposing and developing the photosensitive material.

A third capping layer 393 may be located on the first wavelength conversion pattern 340, the second wavelength conversion pattern 350, and the light transmission pattern 330. In some embodiments, the third capping layer 393 may directly contact the second capping layer 391 in a light blocking region BA.

The color mixing preventing member 380 may be located on a surface (e.g., bottom surface) of the third capping layer 393 which faces the display substrate 10. For example, the third capping layer 393 may be on (e.g., may cover) a top and side surfaces of the color mixing preventing member 380.

The color mixing preventing member 380 may be located in the light blocking region BA to block transmission of light. The color mixing preventing member 380 may be located between the light transmission pattern 330 and the first wavelength conversion pattern 340 and between the first wavelength conversion pattern 340 and the second wavelength conversion pattern 350 to prevent or reduce color mixing between neighboring light transmitting regions.

In some embodiments, the planar arrangement of the color mixing preventing member 380 may be substantially the same or similar to the arrangement of the bank pattern 370 (see FIG. 19) illustrated in FIG. 19. However, the present disclosure is not limited thereto, and the planar structure of the color mixing preventing member 380 can be variously and suitably changed.

In some embodiments, the color mixing preventing member 380 may include (e.g., be) an organic light blocking material and may be formed by coating and exposing the organic light blocking material.

In some embodiments, the color mixing preventing member 380 may directly contact the filler 70.

Other elements of the display device 2 may be substantially the same as those of the display device 1 described above with reference to FIGS. 7 through 20.

Figure 22:
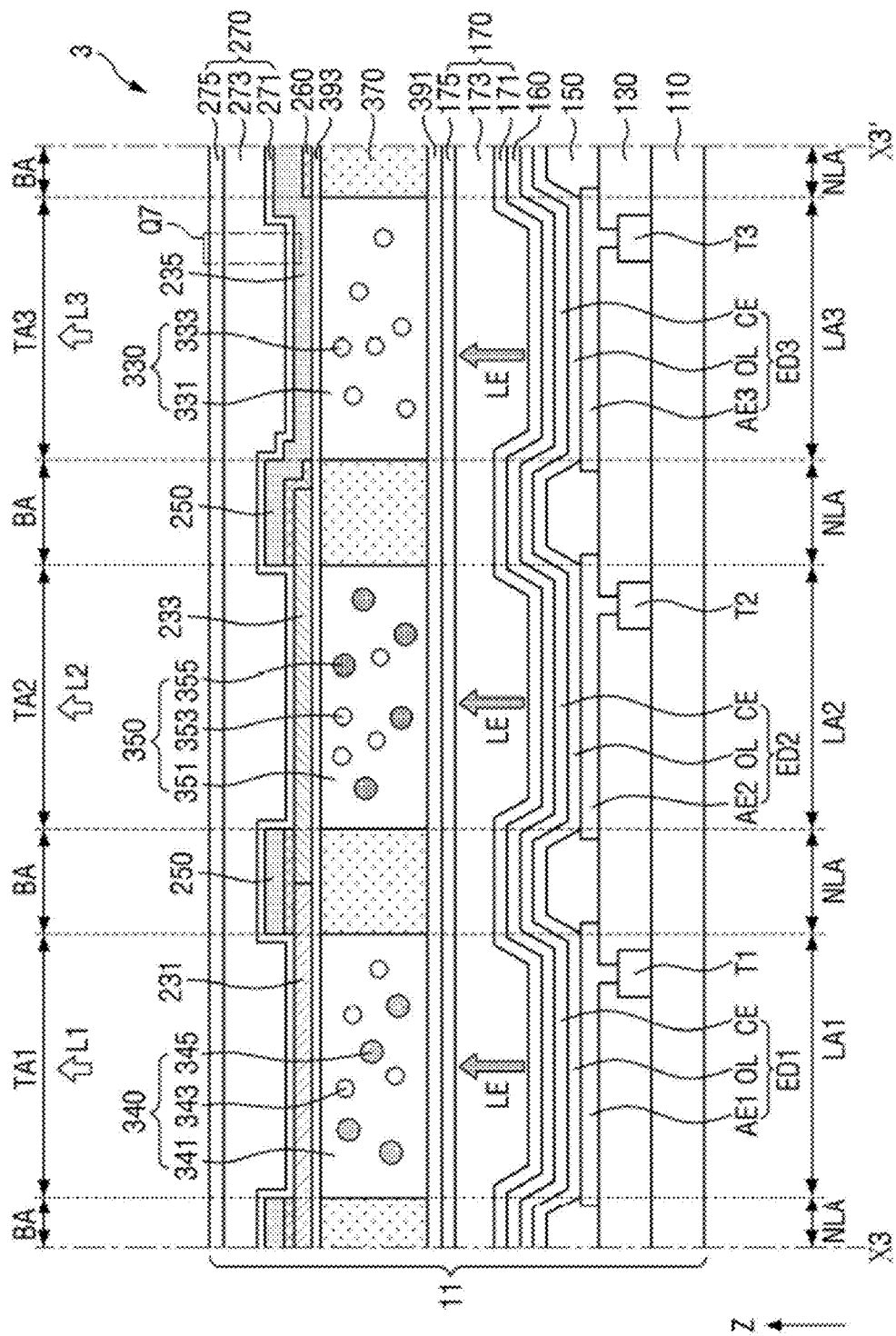
FIG. 22 is a cross-sectional view of a display device according to an embodiment, taken along line X3-X3' of FIGS. 3 and 4.
Figure 23:
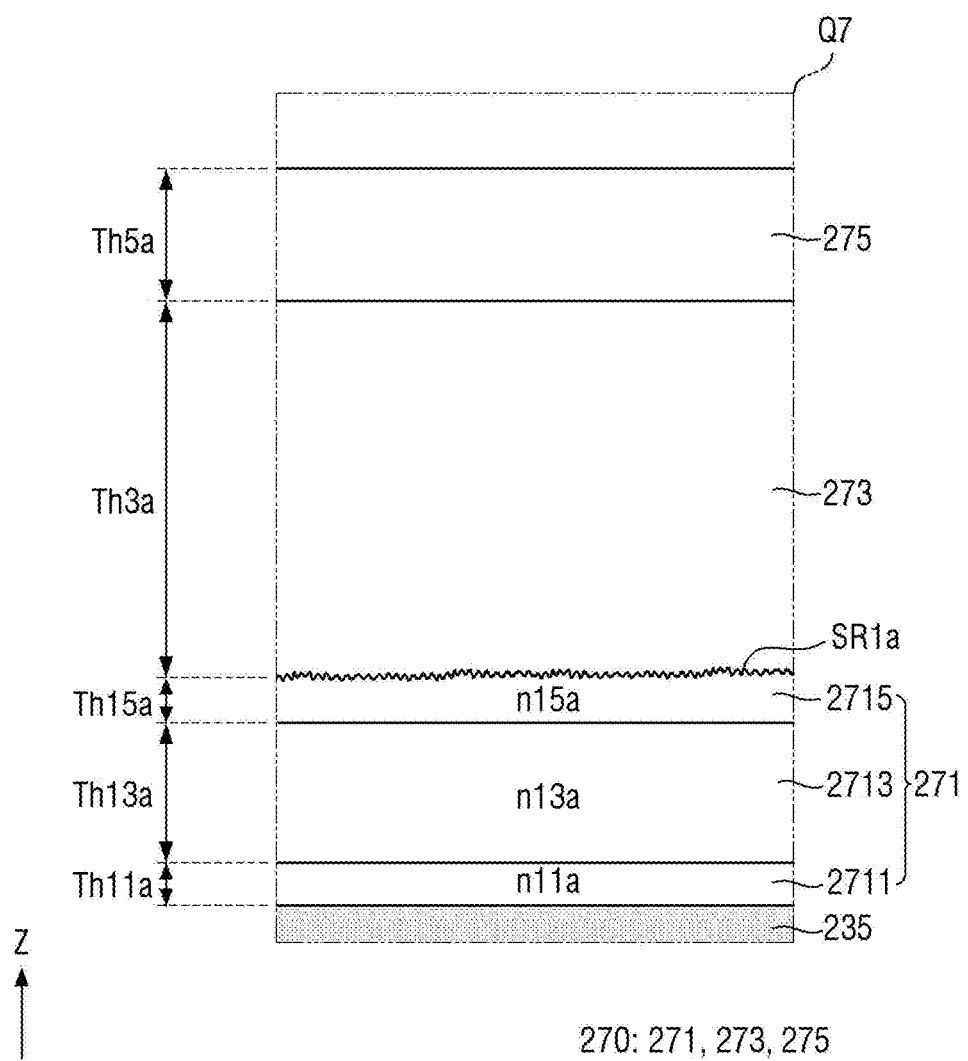
FIG. 23 is an enlarged cross-sectional view of part Q7 of FIG. 22.
Figure 24:
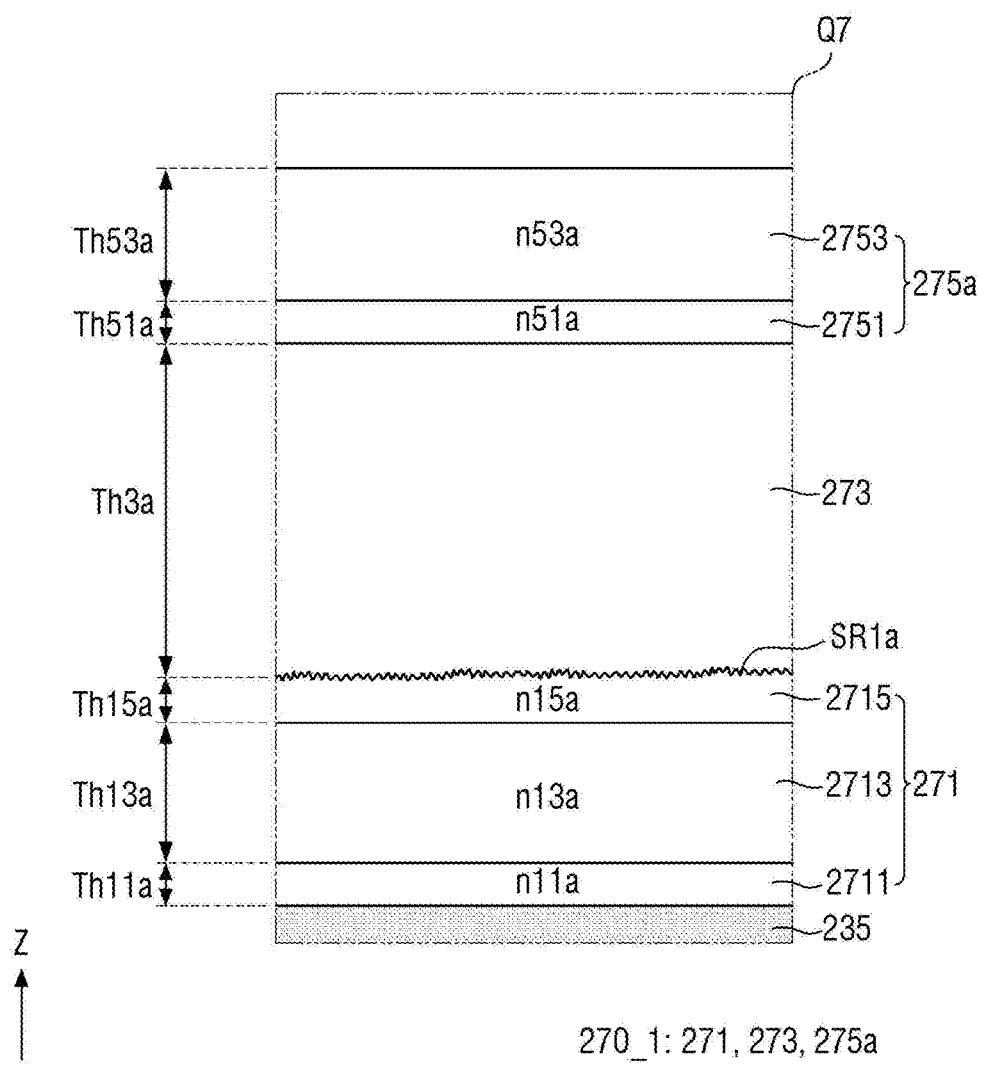
FIG. 24 is a cross-sectional view of a modified example of FIG. 23.

FIG. 22 is a cross-sectional view of a display device 3 according to an embodiment, taken along line X3-X3' of FIGS. 3 and 4. FIG. 23 is an enlarged cross-sectional view of part Q7 of FIG. 22. FIG. 24 is a cross-sectional view of a modified example of FIG. 23.

Referring to FIGS. 22 through 24, the display device 3 according to the current embodiment is substantially the same or similar to the embodiment of FIG. 7 except that a display substrate 11 includes all the elements of the color conversion substrate 30 (see FIG. 7) illustrated in FIG. 7 except for the second base 310, and the filler 70 is omitted. Therefore, differences will be mainly described below.

A thin-film encapsulation layer 170 may be located on a cathode CE. In some embodiments, a first capping layer 160 may be between the cathode CE and the thin-film encapsulation layer 170. The structure of the thin-film encapsulation layer 170 may be substantially the same as the structure illustrated in FIG. 10. In some embodiments, the structure of the thin-film encapsulation layer 170 may be suitably modified to the structure of the thin-film encapsulation layer 170_1 (see FIG. 12) illustrated in FIG. 12, the structure of the thin-film encapsulation layer 170_2 (see FIG. 13) illustrated in FIG. 13, or the structure of the thin-film encapsulation layer 170_3 (see FIG. 14) illustrated in FIG. 14.

A second capping layer 391 may be located on the thin-film encapsulation layer 170. In some embodiments, the second capping layer 391 may contact the thin-film encapsulation layer 170. In some embodiments, the second capping layer 391 may be omitted.

A bank pattern 370, a light transmission pattern 330, a first wavelength conversion pattern 340, and a second wavelength conversion pattern 350 may be located on the second capping layer 391. The bank pattern 370 may overlap a non-light emitting region NLA and define a space corresponding to each of a first light emitting region LA1, a second light emitting region LA2 and a third light emitting region LA3. For example, openings in the bank pattern 370 may define the first light emitting region LA1, the second light emitting region LA2 and the third light emitting region LA3. Each of the light transmission pattern 330, the first wavelength conversion pattern 340 and the second wavelength conversion pattern 350 may be located in the space defined by the bank pattern 370. The first wavelength conversion pattern 340 may overlap the first light emitting region LA1, the second wavelength conversion pattern 350 may overlap the second light emitting region LA2, and the light transmission pattern 330 may overlap the third light emitting region LA3.

A third capping layer 393 may be located on the light transmission pattern 330, the first wavelength conversion pattern 340, and the second wavelength conversion pattern 350. In some embodiments, the third capping layer 393 may also be located on the bank pattern 370.

A first color filter 231 overlapping the first light emitting region LA1, a second color filter 233 overlapping the second light emitting region LA2, a third color filter 235 overlapping the third light emitting region LA3, and a color pattern 250 overlapping the non-light emitting region NLA may be located on the third capping layer 393.

In some embodiments, a portion of the first color filter 231 and a portion of the second color filter 233 may overlap the non-light emitting region NLA, and the color pattern 250 may be located on the first color filter 231 and the second color filter 233 in the non-light emitting region NLA.

In some embodiments, a light blocking pattern 260 may be located between the color pattern 250 and the first color filter 231 and between the color pattern 250 and the second color filter 233 in the non-light emitting region NLA and may overlap the non-light emitting region NLA. In an embodiment, the light blocking pattern 260 may be omitted.

An upper thin-film encapsulation layer 270 may be located on the first color filter 231, the second color filter 233, the third color filter 235, and the color pattern 250.

The upper thin-film encapsulation layer 270 protects elements located under the upper thin-film encapsulation layer 270 from external foreign substances such as moisture.

The upper thin-film encapsulation layer 270 is disposed in all of the first light emitting region LA1, the second light emitting region LA2, the third light emitting region LA3, and the non-light emitting region NLA in a display area DA. In some embodiments, the upper thin-film encapsulation layer 270 may directly cover the first color filter 231, the second color filter 233, the third color filter 235 and the color pattern 250 in the display area DA.

In some embodiments, the upper thin-film encapsulation layer 270 may include a second lower inorganic layer 271, a second organic layer 273, and a second upper inorganic layer 275 stacked sequentially.

In some embodiments, the second lower inorganic layer 271 may directly cover the first color filter 231, the second color filter 233, the third color filter 235 and the color pattern 250 in the display area DA and may cover the bank pattern 370 and the color pattern 250 in a non-display area NDA.

The second organic layer 273 may be located on the second lower inorganic layer 271. The second organic layer 273 may be located over the entire display area DA, and a portion of the second organic layer 273 may be located in the non-display area NDA (see FIG. 1). The second organic layer 273 may be made of the same material as the first organic layer 173 or may include (e.g., be) one or more materials selected from the example materials that may be included in the first organic layer 173.

The second upper inorganic layer 275 may be located on the second organic layer 273. The second upper inorganic layer 275 may cover the second organic layer 273. In some embodiments, the second upper inorganic layer 275 may directly contact the second lower inorganic layer 271 in the non-display area NDA (see FIG. 1) to form an inorganic-inorganic bond. The second upper inorganic layer 275 may be made of the same material as the first upper inorganic layer 175 or may include (e.g., be) one or more materials selected from the example materials that may be included in the first upper inorganic layer 175.

In some embodiments, a thickness Th3a of the second organic layer 273 may be about 2 μm to 8 μm.

The second lower inorganic layer 271 may include (e.g., be) an inorganic material and may have a multilayer structure. In some embodiments, as illustrated in FIG. 24, the second lower inorganic layer 271 may include a seventh sub-inorganic layer 2711 and an eighth sub-inorganic layer 2713. In addition, the second lower inorganic layer 271 may further include a ninth sub-inorganic layer 2715.

The seventh sub-inorganic layer 2711 may be located on (e.g., directly on) the first color filter 231, the second color filter 233, the third color filter 235, and the color pattern 250. The seventh sub-inorganic layer 2711 may prevent the first color filter 231, the second color filter 233, the third color filter 235 and the color pattern 250 from being damaged in the process of forming the eighth sub-inorganic layer 2713, or the seventh sub-inorganic layer 2711 may reduce such damage. For example, the seventh sub-inorganic layer 2711 may function as a protective layer.

In some embodiments, the compressive stress of the seventh sub-inorganic layer 2711 may be 0 MPa to 200 MPa.

The eighth sub-inorganic layer 2713 may be located on the seventh sub-inorganic layer 2711. The eighth sub-inorganic layer 2713 may prevent or block moisture and/or oxygen from penetrating into elements located under the upper thin-film encapsulation layer 270. In some embodiments, the compressive stress of the eighth sub-inorganic layer 2713 may be 0 MPa to 200 MPa.

The ninth sub-inorganic layer 2715 may be located on the eighth sub-inorganic layer 2713. An upper surface of the ninth sub-inorganic layer 2715 may directly contact the second organic layer 273.

An uneven structure SR1a having an irregular pattern may be provided on the upper surface of the ninth sub-inorganic layer 2715 and/or on a surface which contacts the second organic layer 273. Accordingly, the spreadability of the second organic layer 273 can be improved. The surface roughness of the uneven structure SR1a may be 5 nm to 100 nm based on root-mean-square roughness Rq.

In some embodiments, a refractive index n11a of the seventh sub-inorganic layer 2711 and a refractive index n15a of the ninth sub-inorganic layer 2715 may each be smaller than a refractive index n13a of the eighth sub-inorganic layer 2713. For example, the refractive index n13a of the eighth sub-inorganic layer 2713 may be 1.5 to 1.7, and the refractive index n11a of the seventh sub-inorganic layer 2711 and the refractive index n15a of the ninth sub-inorganic layer 2715 may each be 1.3 to less than 1.7 (e.g., equal to or greater than 1.3 and less than 1.7) as long as they are smaller than the refractive index n13a of the eighth sub-inorganic layer 2713.

In some embodiments, a thickness Th11a of the seventh sub-inorganic layer 2711 and a thickness Th15a of the ninth sub-inorganic layer 2715 may each be smaller than a thickness Th13a of the eighth sub-inorganic layer 2713. For example, the thickness Th13a of the eighth sub-inorganic layer 2713 may be 10 Å to 50,000 Å. In some embodiments, the thickness Th11a of the seventh sub-inorganic layer 2711 may be 10 Å to 10,000 Å as long as it is smaller than the thickness Th13a of the eighth sub-inorganic layer 2713. In some embodiments, the thickness Th15a of the ninth sub-inorganic layer 2715 may be 10 Å to 5,000 Å as long as it is smaller than the thickness Th13a of the eighth sub-inorganic layer 2713.

In some embodiments, the eighth sub-inorganic layer 2713 may be made of an oxynitride of a third material such as silicon, aluminum, tungsten and/or titanium, and the seventh sub-inorganic layer 2711 and the ninth sub-inorganic layer 2715 may each be made of an oxide of the third material or an oxynitride of the third material. In addition, a content of oxygen atoms in the eighth sub-inorganic layer 2713 may be smaller than a content of oxygen atoms in the seventh sub-inorganic layer 2711 and/or a content of oxygen atoms in the ninth sub-inorganic layer 2715. In some embodiments, a content of nitrogen atoms in the eighth sub-inorganic layer 2713 may be greater than a content of nitrogen atoms in the seventh sub-inorganic layer 2711 and/or a content of nitrogen atoms in the ninth sub-inorganic layer 2715. For example, the seventh sub-inorganic layer 2711, the eighth sub-inorganic layer 2713, and the ninth sub-inorganic layer 2715 may all be made of silicon oxynitride. In addition, the eighth sub-inorganic layer 2713 may have a relatively lower oxygen atom content than the seventh sub-inorganic layer 2711 and/or the ninth sub-inorganic layer 2715, and the eighth sub-inorganic layer 2713 may have a relatively higher nitrogen atom content than the seventh sub-inorganic layer 2711 and/or the ninth sub-inorganic layer 2715.

Referring to FIG. 24, the upper thin-film encapsulation layer 270 (see FIG. 23) may be modified to an upper thin-film encapsulation layer 270_1 illustrated in FIG. 24. The upper thin-film encapsulation layer 270_1 may include a second lower inorganic layer 271, a second organic layer 273, and a second upper inorganic layer 275a.

The second upper inorganic layer 275a may include a tenth sub-inorganic layer 2751 and an eleventh sub-inorganic layer 2753.

The tenth sub-inorganic layer 2751 may be located on the second organic layer 273 and may block or reduce outgas generated in the second organic layer 273.

The eleventh sub-inorganic layer 2753 may be located on the tenth sub-inorganic layer 2751 and may function as a barrier layer that prevents or blocks penetration of external moisture and/or oxygen.

In some embodiments, a thickness Th51a, refractive index n51a and material of the tenth sub-inorganic layer 2751 may be respectively substantially the same as the thickness Th51 (see FIG. 12), refractive index n51 (see FIG. 12) and material of the fourth sub-inorganic layer 1751 (see FIG. 12) described above in FIG. 12.

In some embodiments, a thickness Th53a, refractive index n53a and material of the eleventh sub-inorganic layer 2753 may be respectively substantially the same as the thickness Th53 (see FIG. 12), refractive index n53 (see FIG. 12) and material of the fifth sub-inorganic layer 1753 (see FIG. 12) described above in FIG. 12.

Furthermore, the relationship between the thickness Th51a of the tenth sub-inorganic layer 2751 and the thickness Th53a of the eleventh sub-inorganic layer 2753, the relationship between the refractive index n51a of the tenth sub-inorganic layer 2751 and the refractive index n53a of the eleventh sub-inorganic layer 2753, and the relationship (e.g., the oxygen atom content magnitude relationship and the nitrogen atom content magnitude relationship) between an inorganic material included in the tenth sub-inorganic layer 2751 and an inorganic material included in the eleventh sub-inorganic layer 2753 may be the same as the relationship between the fourth sub-inorganic layer 1751 (see FIG. 12) and the fifth sub-inorganic layer 1753 (see FIG. 12) described above in FIG. 12, and thus a detailed description thereof may not be provided.

A display device according to the above-described embodiments can prevent or block penetration of moisture and/or oxygen from the outside while preventing or suppressing absorption of light by an inorganic layer of a thin-film encapsulation layer. Therefore, light efficiency can be improved. In addition, because it is possible to prevent elements located under the thin-film encapsulation layer from being damaged, or to reduce such damage, in the process of forming an inorganic layer functioning as a barrier, the reliability of the display device can be improved. Furthermore, because an inorganic layer of the thin-film encapsulation layer which contacts an organic layer includes an uneven structure, the spreadability of an organic material in the process of forming the organic layer can be improved, and the adhesion between layers can be improved, thereby further improving the reliability of the display device.

According to embodiments of the present disclosure, it is possible to provide a display device having improved display quality and reliability.

However, the aspects of the embodiments of the present disclosure are not restricted to the ones set forth herein. The above and other aspects of the embodiments of the present disclosure will become more apparent to one of ordinary skill in the art to which the embodiments pertain by referencing the claims.

Although some embodiments of the present disclosure have been disclosed for illustrative purposes, those of ordinary skill in the art will appreciate that various suitable modifications, additions and/or substitutions are possible, without departing from the scope and spirit of the present disclosure as disclosed in the accompanying claims and equivalents thereof.

What is claimed is:

1. A display device comprising:
a base;
a light emitting element on the base;
a capping layer on the light emitting element;
a thin-film encapsulation layer comprising a first inorganic layer on the capping layer, an organic layer on the first inorganic layer, and a second inorganic layer on the organic layer; and
a wavelength conversion pattern on the thin-film encapsulation layer and overlapping the light emitting element,
wherein the first inorganic layer comprises two sub-inorganic layers having different refractive indices.

2. The display device of claim 1, wherein the first inorganic layer comprises a first sub-inorganic layer on the capping layer and a second sub-inorganic layer on the first sub-inorganic layer, and the second sub-inorganic layer is greater in refractive index than the first sub-inorganic layer.

3. The display device of claim 2, wherein the refractive index of the first sub-inorganic layer and the refractive index of the second sub-inorganic layer are each 1.7 or less.

4. The display device of claim 3, wherein the refractive index of the second sub-inorganic layer is 1.5 to 1.7, and the refractive index of the first sub-inorganic layer is 1.3 to less than 1.7.

5. The display device of claim 4, wherein the capping layer comprises an organic material, and the first sub-inorganic layer directly contacts the capping layer.

6. The display device of claim 4, wherein the second sub-inorganic layer is greater in thickness than the first sub-inorganic layer.

7. The display device of claim 2, wherein each of the first sub-inorganic layer and the second sub-inorganic layer comprises oxygen atoms, and the first sub-inorganic layer is greater in content of oxygen atoms than the second sub-inorganic layer.

8. The display device of claim 7, wherein each of the first sub-inorganic layer and the second sub-inorganic layer further comprises nitrogen atoms, and the second sub-inorganic layer is greater in content of nitrogen atoms than the first sub-inorganic layer.

9. The display device of claim 8, wherein the first sub-inorganic layer and the second sub-inorganic layer are made of silicon oxynitride.

10. The display device of claim 2, wherein the first inorganic layer further comprises a third sub-inorganic layer on the second sub-inorganic layer and contacting the organic layer, and the third sub-inorganic layer comprises an uneven structure contacting the organic layer.

11. The display device of claim 10, wherein a surface of the third sub-inorganic layer which contacts the organic layer is greater in surface roughness than a surface of the first sub-inorganic layer which contacts the second sub-inorganic layer.

12. The display device of claim 10, wherein a root-mean-square surface roughness of the uneven structure is 5 nm to 100 nm.

13. The display device of claim 10, wherein the third sub-inorganic layer is smaller in refractive index than the second sub-inorganic layer, and the third sub-inorganic layer is smaller in thickness than the second sub-inorganic layer.

14. The display device of claim 1, wherein the second inorganic layer comprises a first sub-inorganic layer on the organic layer and a second sub-inorganic layer on the first sub-inorganic layer, and
wherein a refractive index of the first sub-inorganic layer and a refractive index of the second sub-inorganic layer are each 1.7 or less, the second sub-inorganic layer is greater in refractive index than the first sub-inorganic layer, and the second sub-inorganic layer is greater in thickness than the first sub-inorganic layer.

15. The display device of claim 14, wherein the first sub-inorganic layer and the second sub-inorganic layer are made of silicon oxynitride, the first sub-inorganic layer is greater in content of oxygen atoms than the second sub-inorganic layer, and the second sub-inorganic layer is greater in content of nitrogen atoms than the first sub-inorganic layer.

16. The display device of claim 15, further comprising a filler between the wavelength conversion pattern and the thin-film encapsulation layer,
wherein the second inorganic layer further comprises a third sub-inorganic layer between the second sub-inorganic layer and the filler, and the third sub-inorganic layer comprises an uneven structure contacting the filler.

17. The display device of claim 16, wherein the third sub-inorganic layer is smaller in refractive index than the second sub-inorganic layer, and the third sub-inorganic layer is smaller in thickness than the second sub-inorganic layer.

18. The display device of claim 1, further comprising a filler between the wavelength conversion pattern and the thin-film encapsulation layer,
wherein the second inorganic layer comprises a first sub-inorganic layer on the organic layer and a second sub-inorganic layer on the first sub-inorganic layer and contacting the filler, the second sub-inorganic layer comprises an uneven structure contacting the filler, and a root-mean-square surface roughness of the uneven structure is 5 nm to 100 nm.

19. The display device of claim 1, wherein the light emitting element comprises a first light emitting layer, a second light emitting layer and a third light emitting layer overlapping each other, and each of the first light emitting layer, the second light emitting layer and the third light emitting layer are to emit light having a peak wavelength in a range of 440 nm to 550 nm, and
  wherein at least one selected from the first light emitting layer, the second light emitting layer and the third light emitting layer is to emit light having a first peak wavelength, and another one selected from the first light emitting layer, the second light emitting layer and the third light emitting layer is to emit light having a second peak wavelength different from the first peak wavelength.

20. A display device comprising:
a base;
a light emitting element on the base;
a thin-film encapsulation layer comprising a first inorganic layer on the light emitting element, a first organic layer on the first inorganic layer, and a second inorganic layer on the first organic layer;
a wavelength conversion pattern on the thin-film encapsulation layer and overlapping the light emitting element;
a capping layer on the wavelength conversion pattern;
a color filter on the capping layer and overlapping the wavelength conversion pattern; and
an upper thin-film encapsulation layer on the color filter and comprising a third inorganic layer, a second organic layer on the third inorganic layer and a fourth inorganic layer on the second organic layer,
wherein the third inorganic layer comprises a first sub-inorganic layer on the color filter and a second sub-inorganic layer on the first sub-inorganic layer, and the first sub-inorganic layer is different in refractive index than the second sub-inorganic layer.

21. The display device of claim 20, wherein the second sub-inorganic layer is greater in refractive index than the first sub-inorganic layer, and the refractive index of the first sub-inorganic layer and the refractive index of the second sub-inorganic layer are each 1.7 or less.

22. The display device of claim 21, wherein the refractive index of the second sub-inorganic layer is 1.5 to 1.7, and the refractive index of the first sub-inorganic layer is 1.3 to less than 1.7.

23. The display device of claim 22, wherein the color filter comprises an organic material, and the first sub-inorganic layer directly contacts the color filter.

24. The display device of claim 22, wherein the third inorganic layer further comprises a third sub-inorganic layer on the second sub-inorganic layer and contacting the second organic layer, and the third sub-inorganic layer comprises an uneven structure contacting the second organic layer.

25. The display device of claim 24, wherein the third sub-inorganic layer is smaller in refractive index than the second sub-inorganic layer.

26. The display device of claim 24, wherein the fourth inorganic layer comprises a fourth sub-inorganic layer on the second organic layer and a fifth sub-inorganic layer on the fourth sub-inorganic layer, and
  wherein a refractive index of the fourth sub-inorganic layer and a refractive index of the fifth sub-inorganic layer are each 1.7 or less, the fifth sub-inorganic layer is greater in refractive index than the fourth sub-inorganic layer, and the fifth sub-inorganic layer is greater in thickness than the fourth sub-inorganic layer.

* * * * *